United States Patent
Kamijima et al.

(10) Patent No.: US 7,604,910 B2
(45) Date of Patent: Oct. 20, 2009

(54) EXPOSURE MASK, METHOD OF FORMING RESIST PATTERN AND METHOD OF FORMING THIN FILM PATTERN

(75) Inventors: Akifumi Kamijima, Tokyo (JP); Hiroki Matsukuma, Tokyo (JP)

(73) Assignee: TDK Corporation, Tokyo (JP)

( * ) Notice: Subject to any disclaimer, the term of this patent is extended or adjusted under 35 U.S.C. 154(b) by 313 days.

(21) Appl. No.: 11/705,119

(22) Filed: Feb. 12, 2007

(65) Prior Publication Data

US 2007/0196745 A1     Aug. 23, 2007

(30) Foreign Application Priority Data

Feb. 20, 2006   (JP) .............................. 2006-042902

(51) Int. Cl.
*G03F 9/00* (2006.01)
*G03C 5/00* (2006.01)

(52) U.S. Cl. .............................. 430/5; 430/30; 430/311; 430/322

(58) Field of Classification Search ..................... 430/5, 430/30, 311, 322
See application file for complete search history.

(56) References Cited

U.S. PATENT DOCUMENTS 5,242,770 A    9/1993  Chen et al.
7,506,299 B2 * 3/2009  Socha et al. ................. 716/19
2009/0004577 A1 * 1/2009  Shim ............................. 430/5
2009/0081564 A1 * 3/2009  Yasuzato ...................... 430/5

FOREIGN PATENT DOCUMENTS

| JP | A 03-0210560 | 9/1991 |
| JP | B2 06-090506 | 11/1994 |
| JP | B2 2881892 | 4/1999 |
| JP | B2 3009923 | 2/2000 |
| WO | WO 93/14445 | 7/1993 |

* cited by examiner

*Primary Examiner*—Christopher G Young
(74) *Attorney, Agent, or Firm*—Oliff & Berridge, PLC

(57) ABSTRACT

An exposure mask capable of improving resolution is provided. An exposure mask includes one slit-shaped main transmission region and three pairs of slit-shaped auxiliary transmission regions arranged in order in a direction perpendicular to the longitudinal direction of the main transmission region, each pair of auxiliary transmission regions facing each other with the main transmission region in between. Compared to the case where two or less pairs of auxiliary transmission regions are included, light intensity contrast becomes higher in an end portion in a slit width direction of the main transmission region by exposing and developing a resist film through the use of the exposure mask, so the exposed width of the resist film is narrowed.

24 Claims, 16 Drawing Sheets

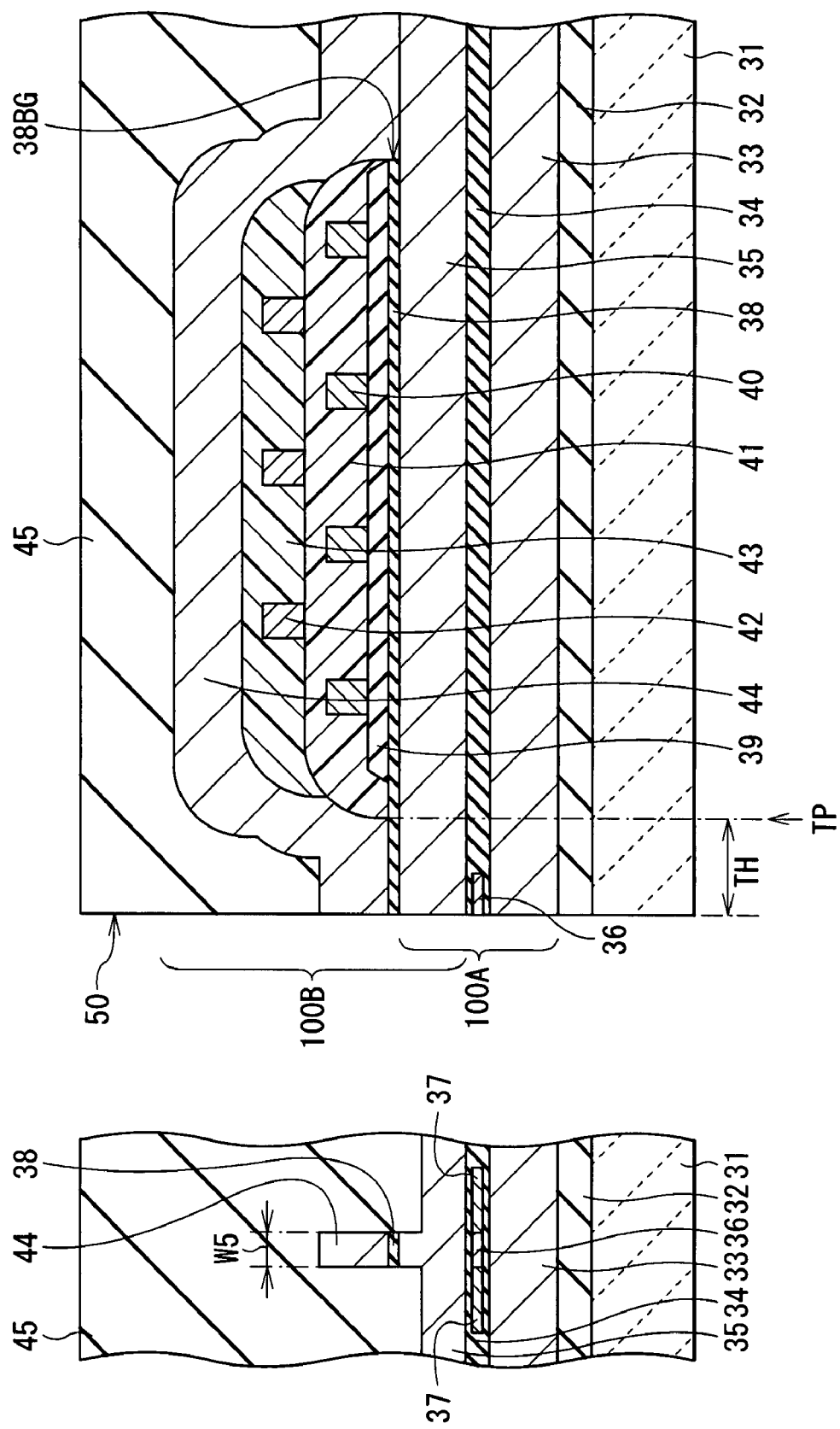

EXPOSURE MASK, METHOD OF FORMING RESIST PATTERN AND METHOD OF FORMING THIN FILM PATTERN

BACKGROUND OF THE INVENTION

1. Field of the Invention

The present invention relates to an exposure mask used in photolithography, a method of forming a resist pattern through the use of the exposure mask, and a method of forming a thin film pattern by applying the method of forming a resist pattern.

2. Description of the Related Art

In recent years, in the field of manufacturing various devices, in order to form a thin film pattern into a desired shape, a resist pattern is widely used. Typically, the resist pattern is formed by forming a resist film, and then patterning the resist film by photolithography. More specifically, after the resist film is selectively exposed through the use of an exposure mask, the resist film is developed.

In order to achieve high resolution in a photolithography step, a large number of structural examples of the exposure mask have been proposed. More specifically, there is known an exposure mask in which an aperture and first and second aperture patterns arranged around the aperture are included, and the first and second aperture patterns are very thin patterns with a resolution limit or less for incident light, and the phases of light passing through the first and second aperture patterns are 180° different from each other (for example, refer to Japanese Examined Patent Application Publication No. H06-090506). Moreover, there is known an exposure mask in which a main aperture part and auxiliary aperture parts arranged in parallel on both sides or either side of the main aperture part are included, and the widths and positional relationship of the main aperture part and the auxiliary aperture parts are determined on the basis of conditions (numerical aperture, reduction/magnification and exposure wavelength) of an exposure apparatus (for example, refer to Japanese Patent No. 2881892). Further, there is known an exposure mask in which at least one additional line disposed at a predetermined distance away from an edge of a lithography pattern with critical dimensions and altering the edge intensity gradient of the edge is included, and the predetermined distance is proportional to the critical dimensions (for example, refer to Japanese Patent No. 3009923).

SUMMARY OF THE INVENTION

However, in consideration of today's technical trend toward a further reduction in the width of a thin film pattern according to a reduction in device size, the resolution obtained in the case of using an exposure mask in a related art is not sufficient, so a further improvement in resolution is desired.

Depending on manufacturing fields using exposure masks, in addition to an improvement in resolution, the expansion of a height (thickness of a resist film) range capable of obtaining desired resolution may be desired. More specifically, in the field of manufacturing semiconductors or the like in which a thin film pattern needs only a relatively thin thickness (for example, 0.3 µm or less), the resolution is easily stabilized in the thickness range, so consideration is given only to simply obtaining desired resolution without concern for the thickness of the resist film. On the other hand, in the field of manufacturing thin film magnetic heads or the like in which the thin film pattern needs a relatively large thickness (for example, 0.5 µm or over), it is difficult to stabilize the resolution in the thickness range, so it is necessary not only to simply obtain desired resolution but also to expand the height range capable of obtaining desired resolution in a thickness direction of the resist film. It is because in the case where a top pole layer is formed as an example of the thin film pattern, it is necessary for the top pole layer to have a very small uniform width and a sufficient thickness.

In view of the foregoing, it is desirable to provide an exposure mask and a method of forming a resist pattern capable of improving resolution, and a method of forming a thin film pattern capable of forming a thin film pattern so as to have a very small uniform width.

Moreover, it is desirable to provide an exposure mask and a method of forming a resist pattern capable of expanding a height range capable of obtaining desired resolution, and a method of forming a thin film pattern capable of forming a thin film pattern so as to have a very small uniform width and a sufficient thickness.

According to an embodiment of the invention, there is provided a first exposure mask including: a slit-shaped main transmission region; and three or more pairs of slit-shaped auxiliary transmission regions arranged in order in a direction perpendicular to the longitudinal direction of the main transmission region, each pair of auxiliary transmission regions facing each other with the main transmission region in between. Moreover, according to an embodiment of the invention, there is provided a second exposure mask including: a main transmission region; and three or more circular auxiliary transmission regions arranged in order around the main transmission region. Further, according to an embodiment of the invention, there is provided a third exposure mask including: a main transmission region including a uniform width region extending with a uniform width and a widening region having a width gradually increasing from the uniform width of the uniform width region; and three or more pairs of slit-shaped auxiliary transmission region arranged in order in a direction perpendicular to the longitudinal direction of the main transmission region, each pair of auxiliary transmission regions facing each other with the uniform width region in the main transmission region in between.

According to an embodiment of the invention, there is provided a method of forming a resist pattern including: a first step of forming a resist film; a second step of selectively exposing the resist film through the use of any of the above-described exposure masks; and a third step of developing the exposed resist film.

According to an embodiment of the invention, there is provided a method of forming a thin film pattern including: a first step of forming a resist pattern by the above-described method of forming a resist pattern; and a second step of forming a thin film pattern through the use of the resist pattern.

In the first exposure mask, the second exposure mask, the third exposure masks, the method of forming a resist pattern or the method of forming a thin film pattern according to the embodiment of the invention, the exposure mask includes three or more pairs of or three or more auxiliary transmission regions, so compared to the case where an exposure mask includes two or less pairs of or two or less auxiliary transmission regions, so light intensity contrast is higher in an end portion in a slit width direction of the main transmission region. Thereby, in the case where the resist film is selectively exposed through the use of the exposure mask, the exposed width of the resist film is narrowed, so resolution is improved. In this case, for example, when spacings between the main transmission region and one pair of auxiliary transmission region closest to the main transmission region are larger than spacings between the auxiliary transmission regions, compared to the case where these spacings are equal to each other, the above-described light intensity contrast is slightly lower; however, it is difficult to expose the resist film in a region corresponding to the spacings between the main transmission region and the one pair of auxiliary transmission region closest to the main transmission region, so the height (the thickness of the resist film) range capable of obtaining desired resolution is expanded.

In the first exposure mask according to the embodiment of the invention, firstly, the main transmission region and the auxiliary transmission regions may allow exposure light to pass through in the same phase, or a phase of exposure light passing through a region of the main transmission region and the auxiliary transmission regions may be opposite to that of exposure light passing through an adjacent region. Secondly, spacings between the main transmission region and one pair of the auxiliary transmission region closest to the main transmission region may be equal to or larger than spacings between the auxiliary transmission regions. In this case, spacings between the auxiliary transmission regions may be equal to each other. Thirdly, a relationship of $S1 \geq T \times 0.095 + 0.22$ µm is preferably satisfied, where spacings between the main transmission region and one pair of the auxiliary transmission regions closest to the main transmission region are $S1$ (µm), respectively, and the thickness of a resist film exposed to exposure light is $T$ (µm). Fourthly, the slit widths of the auxiliary transmission regions may be equal to or smaller than the slit width of the main transmission region. Fifthly, the slit lengths of the auxiliary transmission regions may be equal to or larger than the slit length of the main transmission region, or the slit lengths of the auxiliary transmission regions may gradually increase with distance from the main transmission region.

In the third exposure mask according to the embodiment of the invention, the slit lengths of the auxiliary transmission regions may be equal to the length of the uniform width region, or the slit lengths of the auxiliary transmission regions may gradually increase along the outer edge of the widening region in the main transmission region with distance from the uniform width region in the main transmission region. Moreover, the slit lengths of the auxiliary transmission regions may be larger than the length of the uniform width region in the main transmission region, and be bended along the outer edge of the widening region in the main transmission region according to an increase in the width of the widening region. In this case, the slit lengths of the auxiliary transmission regions may be equal to each other.

In the method of forming a resist pattern according to the embodiment of the invention, in the first step, the thickness of the resist film is preferably 0.5 µm or over. Moreover, in the second step, oblique illumination may be used, or normal illumination may be used, and a ratio $\sigma(=NA1/NA2)$ between the numerical aperture NA1 of a illumination system and the numerical aperture NA2 of an optical system may be 0.3 or less.

In the method of forming a thin film pattern according to the embodiment of the invention, in the first step, a positive resist may be used, and in the second step, a plating film may be selectively grown through the use of the resist pattern as a frame. In this case, in the second step, a pole layer of a thin film magnetic head may be formed as a thin film pattern.

In the exposure masks, the method of forming a resist pattern and the method of forming a thin film pattern according to the embodiment of the invention, the exposure mask includes three or more pairs of or three or more auxiliary transmission regions, so resolution can be improved, and a thin film pattern can be formed so as to have a very small uniform width in a height (thickness of the resist film) direction. In this case, for example, when a spacing between the main transmission region and one pair of auxiliary transmission regions closest to the main transmission region is larger than spacings between the auxiliary transmission regions, a height range capable of obtaining desired resolution can be expanded, and a thin film pattern can be formed so as to have a very small uniform width and a sufficient thickness.

Other and further objects, features and advantages of the invention will appear more fully from the following description.

BRIEF DESCRIPTION OF THE DRAWINGS

FIGS. 13A and 13B are sectional views of a thin film magnetic head manufactured by a method of manufacturing a thin film magnetic head based on a method of forming a thin film pattern;

DETAILED DESCRIPTION OF THE PREFERRED EMBODIMENTS

Figure 1A:
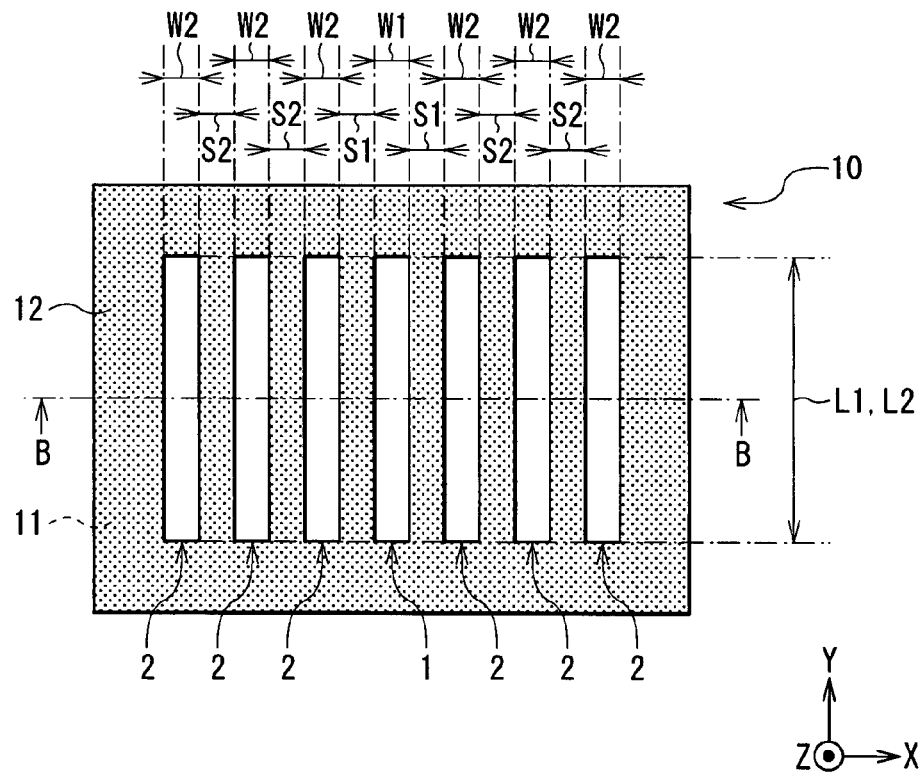
FIGS. 1A, 1B and 1C are illustrations showing a first structural example of an exposure mask used in a method of forming a thin film pattern according to a first embodiment of the invention.

Preferred embodiments will be described in detail below referring to the accompanying drawings.

First Embodiment

At first, referring to FIGS. 1A, 1B and 1C through FIGS. 8A, 8B and 8C, an exposure mask used in a method of forming a thin film pattern according to a first embodiment of the invention will be described below. FIGS. 1A, 1B and 1C through FIGS. 8A, 8B and 8C show eight structural examples of exposure masks 10, and FIGS. 1A, 2A, 3A, 4A, 5A, 6A, 7A and 8A show plan views, FIGS. 1B, 2B, 3B, 4B, 5B, 6B, 7B and 8B show sectional views taken along lines B-B of FIGS. 1A, 2A, 3A, 4A, 5A, 6A, 7A and 8A respectively, and FIGS. 1C, 2C, 3C, 4C, 5C, 6C, 7C and 8C show transmission characteristics.

The exposure mask 10 is used to selectively expose a resist film, and as shown in FIGS. 1A and 1B through FIGS. 8A and 8B, in the exposure mask 10, a light-shielding film 12 (made of, for example, chromium (Cr) or the like) is arranged on a surface of a transparent substrate 11 (made of, for example, quartz glass or the like) so that a part of the transparent substrate 11 is exposed. As regions for allowing exposure light to pass through, the exposure mask 10 includes a one slit-shaped main transmission region 1 and three or more pairs of slit-shaped auxiliary transmission regions 2 arranged so as to face each other with the main transmission region 1 in between in the exposed part of the transparent substrate 11. The main transmission region 1 and the auxiliary transmission regions 2 are regions where almost all exposure light pass through (transmittance=approximately 100%), and a region covered with the light-shielding film 12 (non-transmission region) is a region where almost all exposure light is blocked (transmittance=approximately 0%). In FIGS. 1A through 8A, the above-described non-transmission region is darkly shaded.

The main transmission region 1 is a region for practically exposing a resist film, and has a pattern shape corresponding to an exposure pattern of the resist film. In this case, the main transmission region 1 has, for example, a rectangular pattern shape having a slit width W1 (µm) and a slit length L1 (µm). The above-described "practically exposing a resist film" means in the case where a positive resist film is exposed, exposing the resist film so that when the exposed resist film is developed, an aperture is formed in a region corresponding to the main transmission region 1.

The auxiliary transmission regions 2 control the state of exposing the resist film in a region corresponding to the main transmission region 1, and the auxiliary transmission regions 2 are arranged in parallel with the main transmission region 1. In this case, for example, three pairs of auxiliary transmission regions 2 (three on the right side of the main transmission region 1 and three on the left side, that is, total six auxiliary transmission regions 2) are arranged, and each of the auxiliary transmission regions 2 has a rectangular pattern shape having a slit width W2 (µm) and a slit length L2 (µm). The above-described "the auxiliary transmission regions 2 face each other with the main transmission region 1 in between" means that the main transmission region 1 does not get out of the auxiliary transmission regions 2 in an extending direction, that is, the main transmission region 1 is placed in a region sandwiched between each pair of the auxiliary transmission regions 2.

The main transmission region 1 and one pair of the auxiliary transmission regions 2 closest to the main transmission region 1 are arranged with a spacing S1 (µm), and the auxiliary transmission regions 2 are arranged with spacings S2 (µm).

The structure of the exposure mask 10 can be freely set by appropriately combining a series of structural conditions typified by (1) a relationship between the slit widths W1 and W2, (2) a relationship between the slit widths W2, (3) a relationship between the slit lengths L1 and L2, (4) a relationship between the slit lengths L2, (5) a relationship between the spacings S1 and S2, (6) a relationship between the spacings S2, and (7) the presence or absence of phase inversion (a so-called shifter).

Figure 1B:
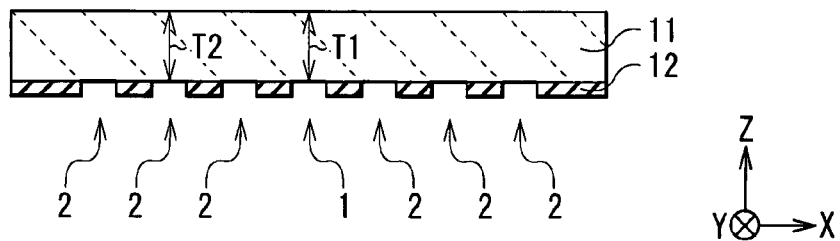
Figure 1C:
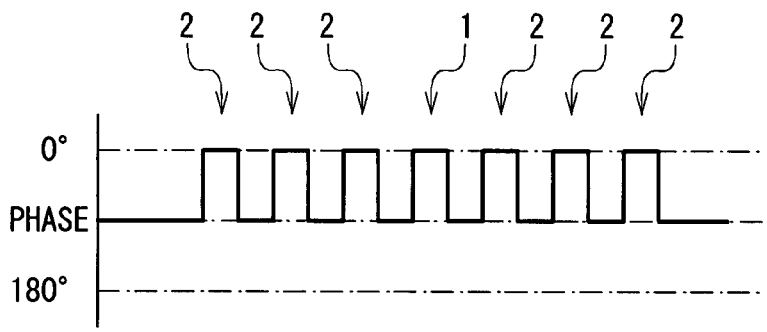

More specifically, in the case shown in FIGS. 1A, 1B and 1C, as shown in FIGS. 1A and 1B, the slit widths W1 and W2 are the same as each other, the slit lengths L1 and L2 are the same as each other, the spacings S1 and S2 are the same as each other, and the slit widths W2 are the same as each other, the slit lengths L2 are the same as each other, and the spacings S2 are the same as each other. Moreover, the main transmission region 1 and the auxiliary transmission regions 2 allow exposure light to pass through in the same phase. More specifically, a thickness T1 of the transparent substrate 11 in the main transmission region 1 and a thickness T2 of the transparent substrate 1 in the auxiliary transmission region 2 are the same as each other, so as shown in FIG. 1C, in the case where the phase of the exposure light before passing through is 0°, the phase of the exposure light after passing through is still 0°. The above-described "being the same as each other" in dimensional relationships such as the slit widths W1 and W2 means not only being exactly the same but also being the same within some tolerance (being substantially the same).

In particular, the spacing S1 satisfies a relationship of $S1 \geq T \times 0.095 + 0.22$ µm with the thickness T (µm) of the resist film exposed to exposure light. The spacing S1 is preferably as small as possible within a range satisfying the above-described relationship. As an example, the lower limit of the spacing S1 is approximately 0.3 µm in the case where the thickness T is 0.8 µm, or approximately 0.7 µm in the case where the thickness T is 5 µm. The above-described relational expression is an empirical expression derived from a correlation between the spacing S1 and the thickness T taken as an example.

Figure 2A:
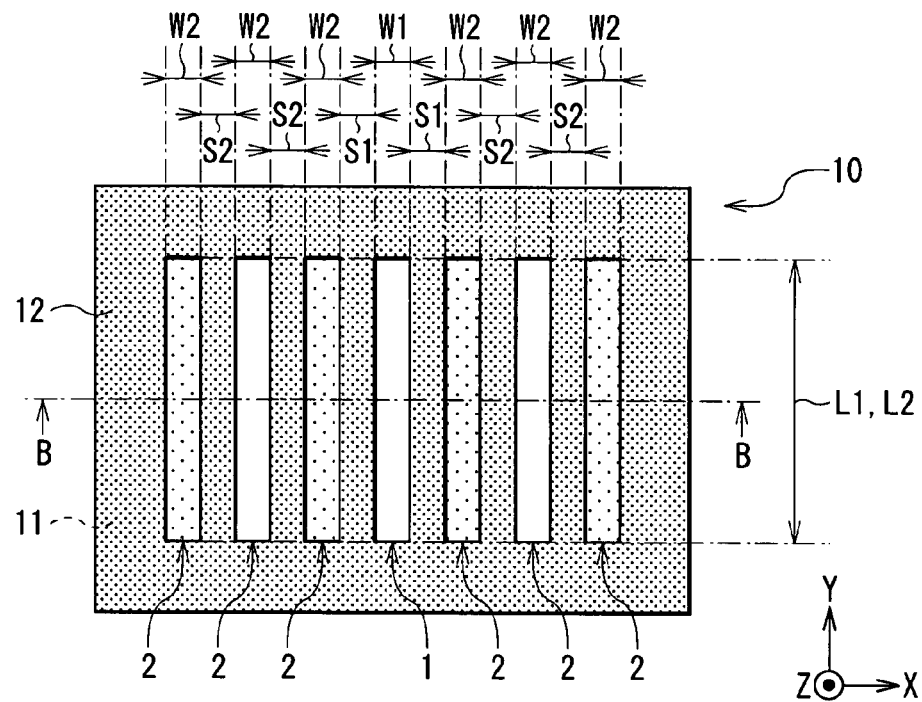
FIGS. 2A, 2B and 2C are illustrations showing a second structural example of the exposure mask.
Figure 2B:
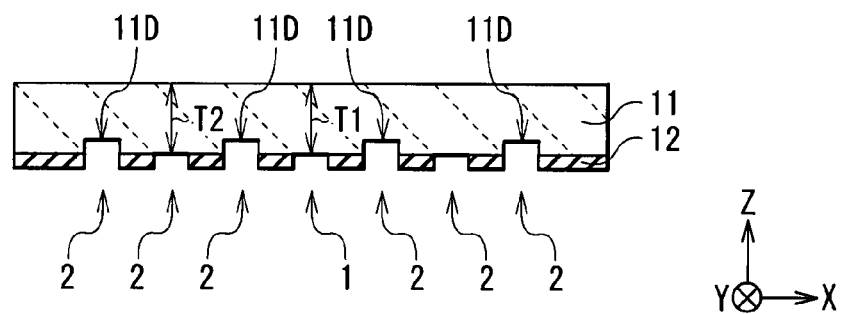
Figure 2C:
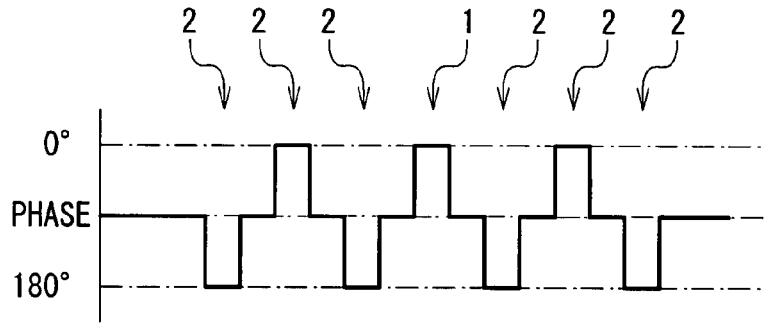

In the case of FIGS. 2A, 2B and 2C, as shown in FIGS. 2A and 2B, the exposure mask 10 has the same structure as that shown in FIGS. 1A, 1B and 1C, except that a phase of exposure light passing through a region of the main transmission region 1 and the auxiliary transmission regions 2 is opposite to that of exposure light passing through an adjacent region. More specifically, depressions 11D are selectively arranged in the transparent substrate 11 in positions corresponding to the first and the third pairs of auxiliary transmission regions 2 from a side close to the main transmission region 1 so that the thicknesses T2 of the positions are smaller than the thickness T1 and the thicknesses T2 of other positions. The depths of the depressions 11D are equal to an optical distance capable of inverting the phase of exposure light by 180° at the time of passing through the auxiliary transmission region 2, and are determined on the basis of the wavelength λ of exposure light and the refractive index n of the transparent substrate 11. Thereby, as shown in FIG. 2C, whereas the phases after passing through the main transmission region 1 and the auxiliary transmission region 2 not including the depressions 11D are still 0°, the phases after passing through the auxiliary transmission regions 2 including depression 11D are inverted by 180° (that is, so-called phase inversion). In FIG. 2A, to clearly show the presence or absence of phase inversion, the auxiliary transmission regions 2 in which the phases are inverted are lightly shaded.

Figure 3A:
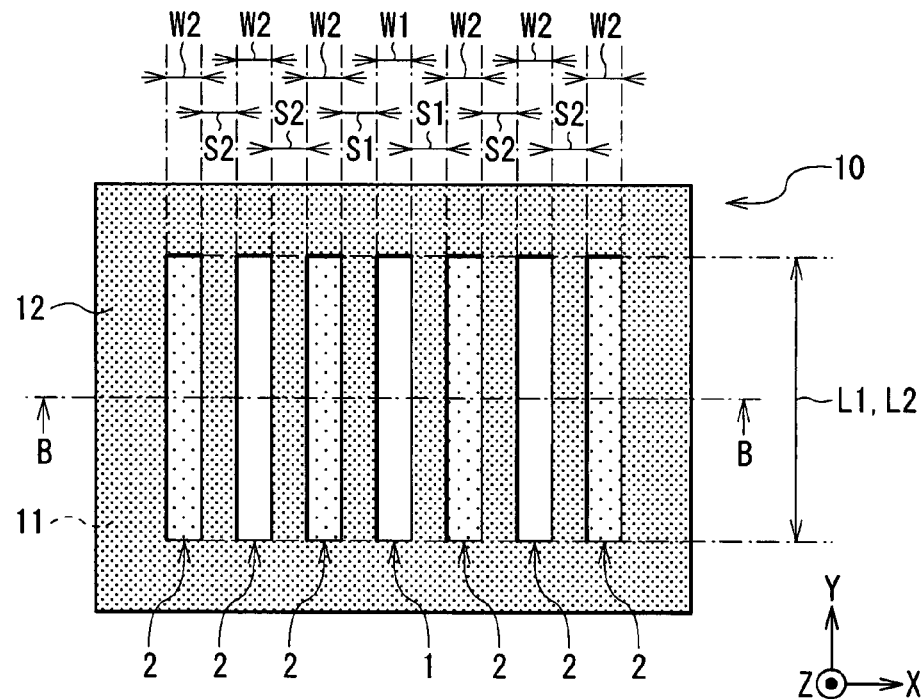
FIGS. 3A, 3B and 3C are illustrations showing a third structural example of the exposure mask.
Figure 3B:
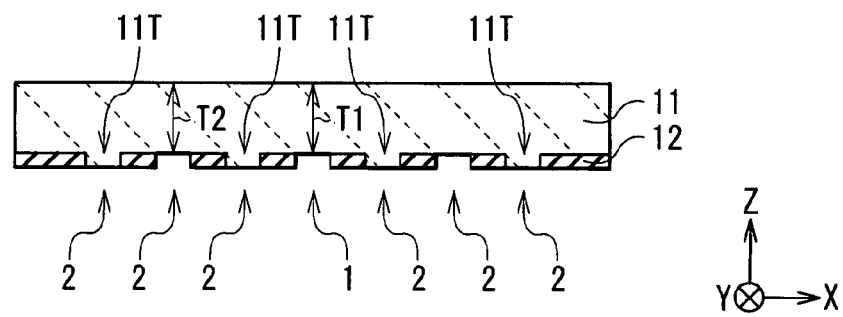
Figure 3C:
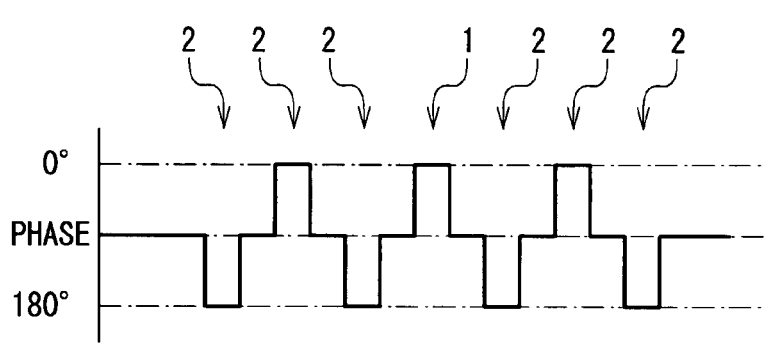

In the case shown in FIGS. 3A, 3B and 3C, as shown in FIGS. 3A and 3B, the exposure mask 10 has the same structure as that in the case shown in FIGS. 2A, 2B and 2C, except that instead of the depressions 11D, projections 11T are arranged in the transparent substrate 11. The thicknesses of the projections 11T are equal to an optical distance capable of inverting the phase of exposure light by 180° as in the case of the depressions 11D, so as shown in FIG. 3C, the same transmission characteristics as those in the case shown in FIG. 2C can be obtained.

Figure 4A:
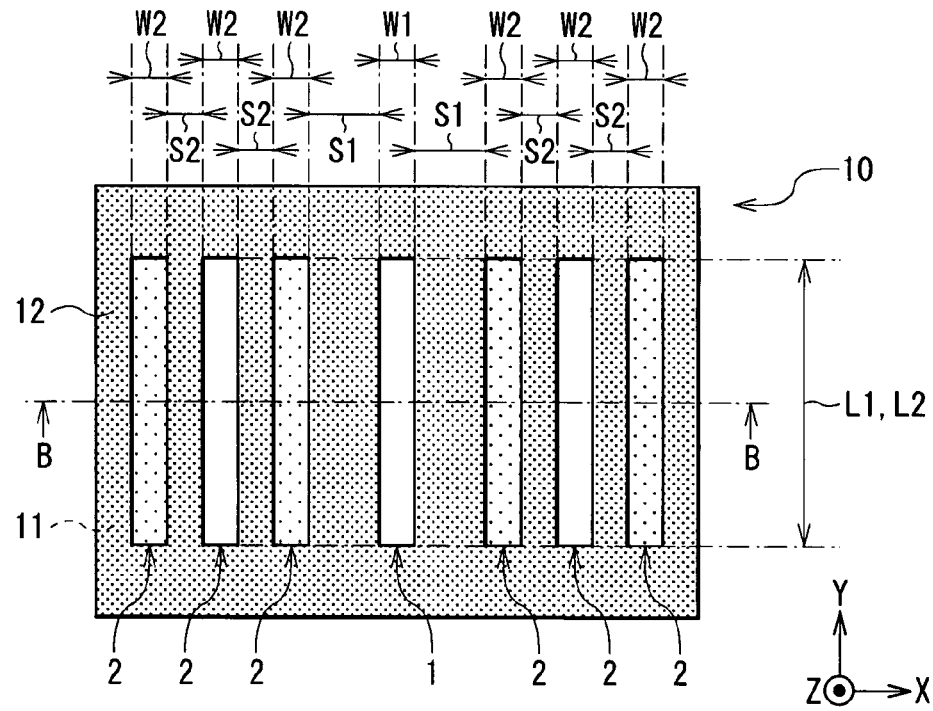
FIGS. 4A, 4B and 4C are illustrations showing a fourth structural example of the exposure mask.
Figure 4B:
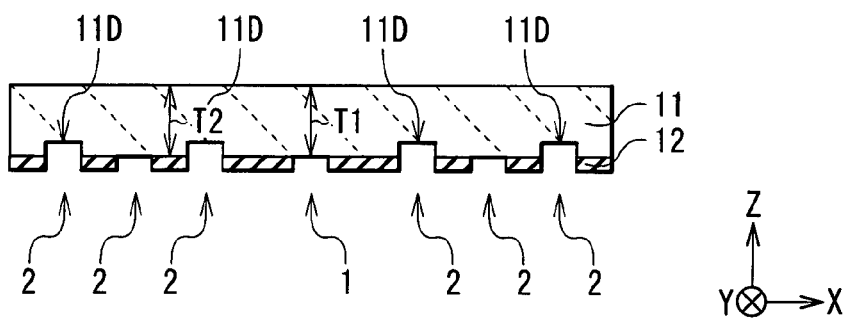
Figure 4C:
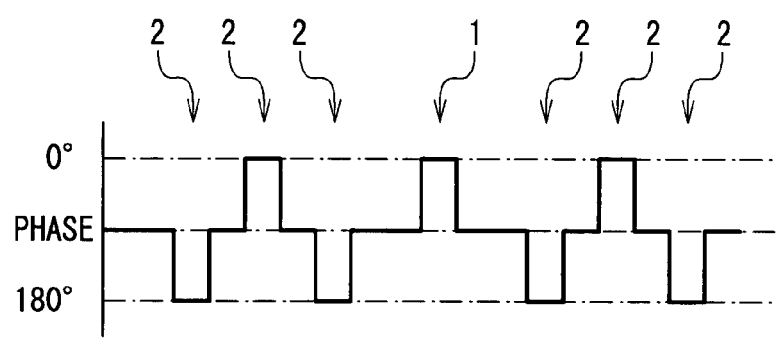

In the case shown in FIGS. 4A, 4B and 4C, as shown in FIGS. 4A, 4B and 4C, the exposure mask 10 has the same structure and the same transmission characteristics as those in the case shown in FIGS. 2A, 2B and 2C, except that the spacing S1 is larger than the spacings S2.

Figure 5A:
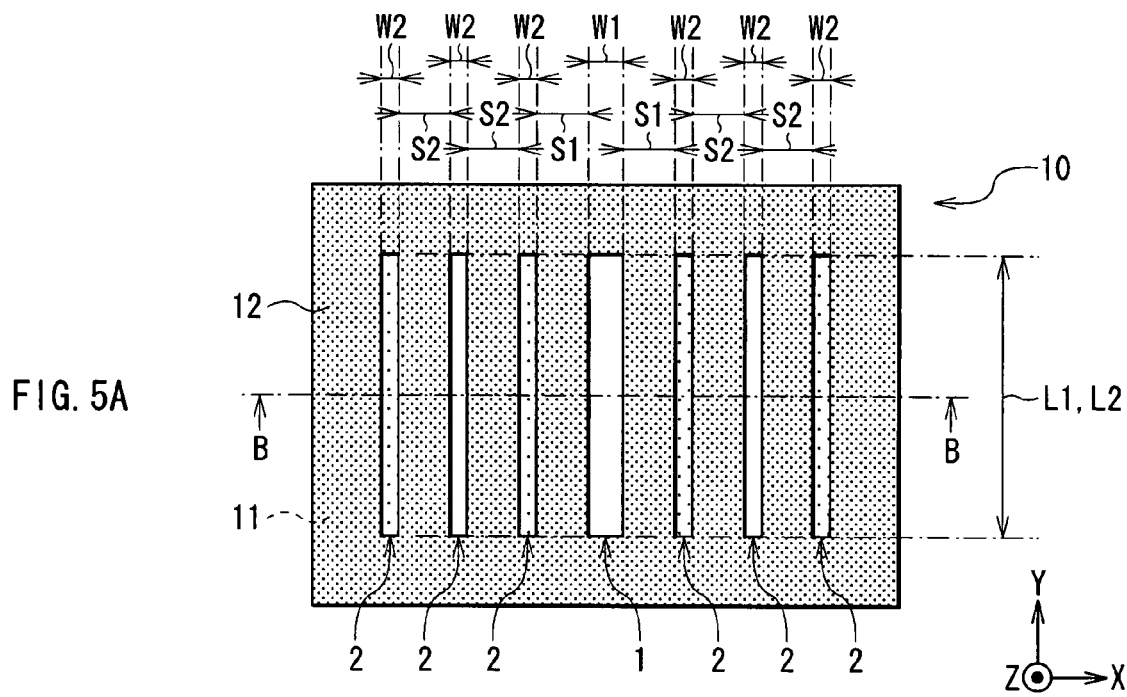
FIGS. 5A, 5B and 5C are illustrations showing a fifth structural example of the exposure mask.
Figure 5B:
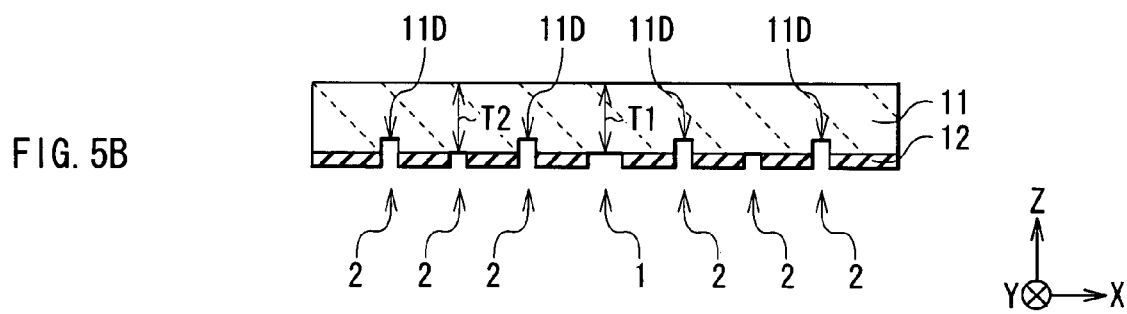
Figure 5C:
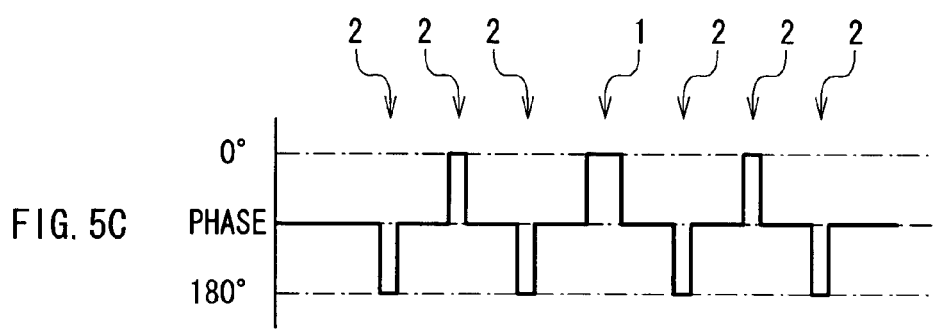

In the case shown in FIGS. 5A, 5B and 5C, as shown in FIGS. 5A, 5B and 5C, the exposure mask 10 has the same structure and the same transmission characteristics as those in the case shown in FIGS. 2A, 2B and 2C, except that the slit widths W2 are smaller than the slit width W1.

Figure 6A:
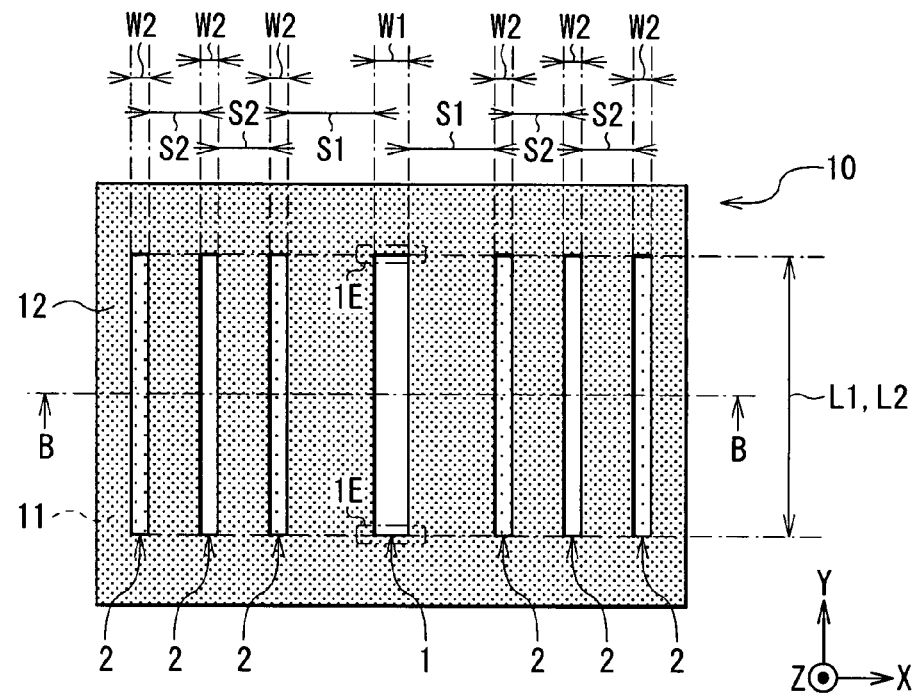
FIGS. 6A, 6B and 6C are illustrations showing a sixth structural example of the exposure mask.
Figure 6B:
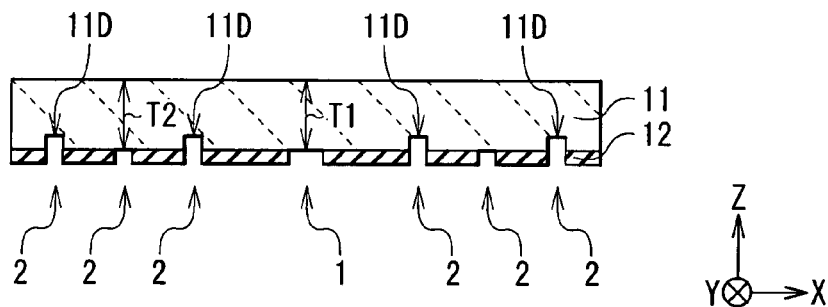
Figure 6C:
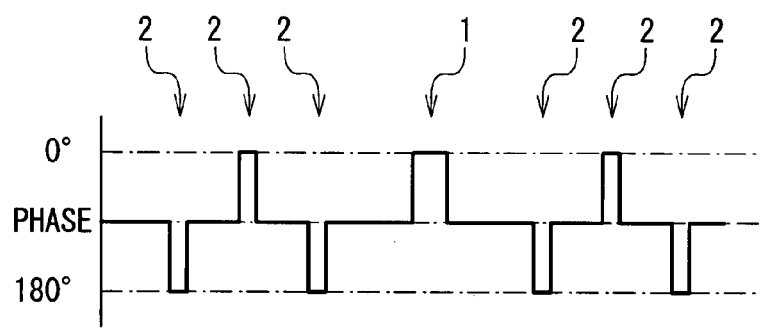

In the case shown in FIGS. 6A, 6B and 6C, as shown in FIGS. 6A, 6B and 6C, the exposure mask 10 has the same structure and the same transmission characteristics as those in the case shown in FIGS. 5A, 5B and 5C, except that the spacing S1 is larger than the spacings S2.

Figure 7A:
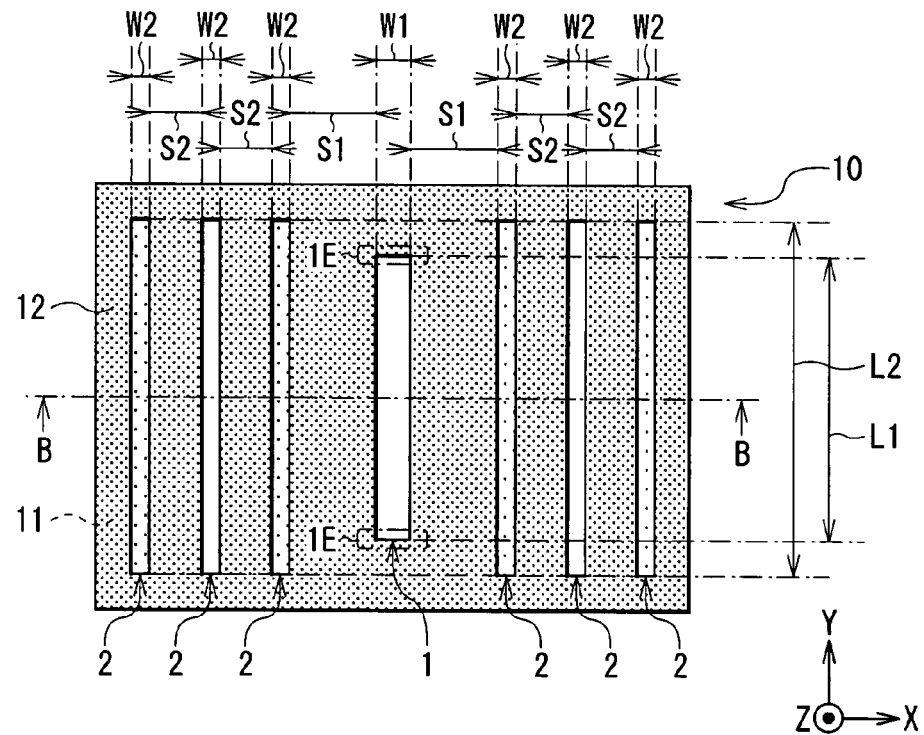
FIGS. 7A, 7B and 7C are illustrations showing a seventh structural example of the exposure mask.
Figure 7B:
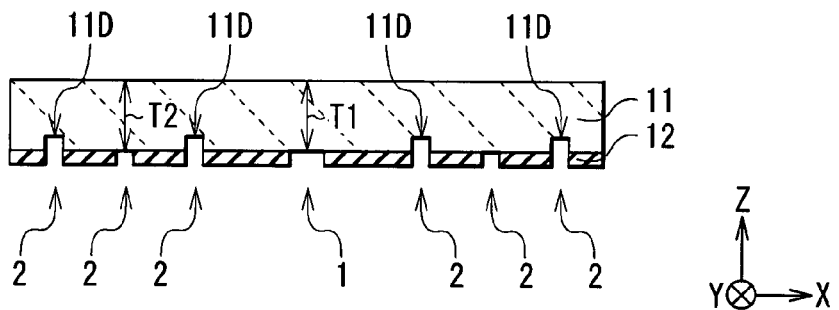
Figure 7C:
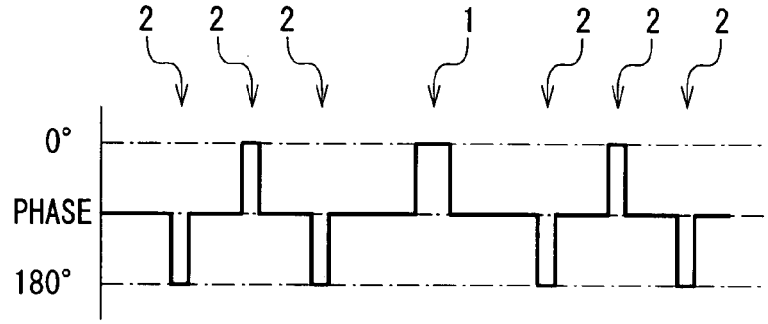

In the case shown in FIGS. 7A, 7B and 7C, as shown in FIGS. 7A, 7B and 7C, the exposure mask 10 has the same structure and the same transmission characteristics as those in the case shown in FIGS. 6A, 6B and 6C, except that the slit lengths L2 are larger than the slit length L1.

Figure 8A:
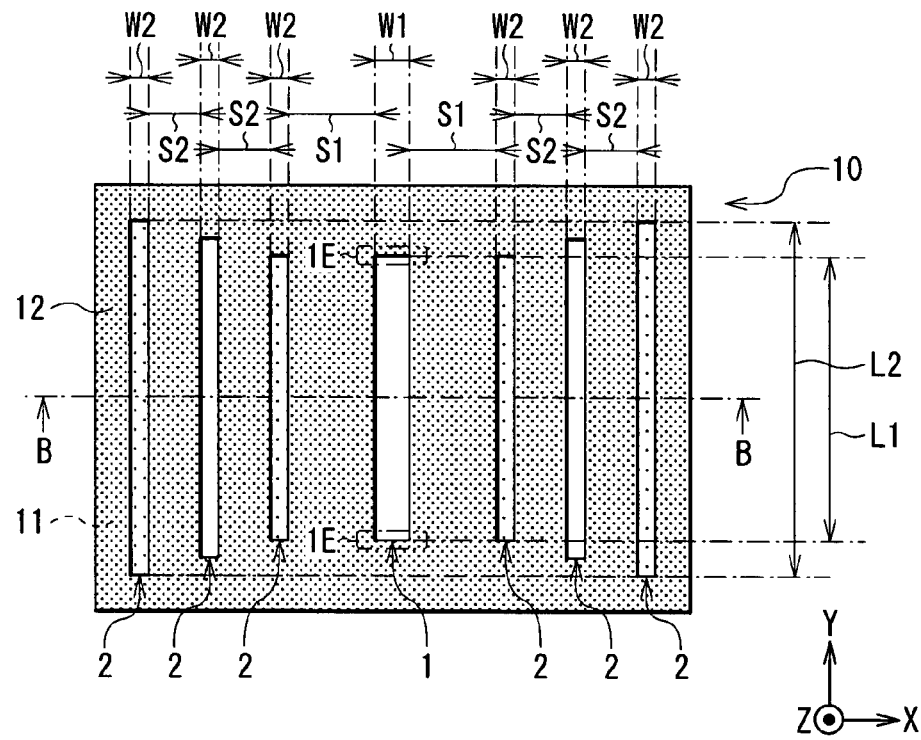
FIGS. 8A, 8B and 8C are illustrations showing an eighth structural example of the exposure mask.
Figure 8B:
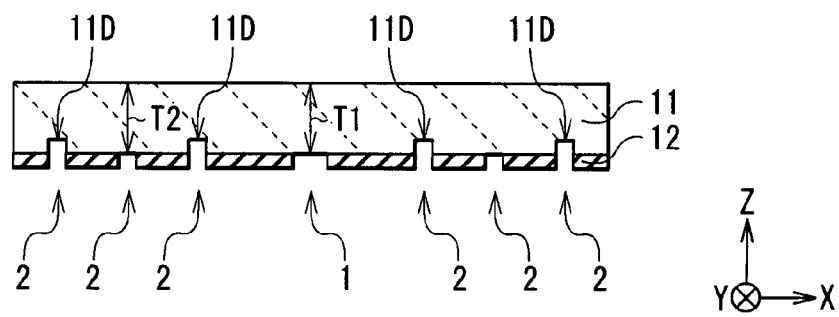
Figure 8C:
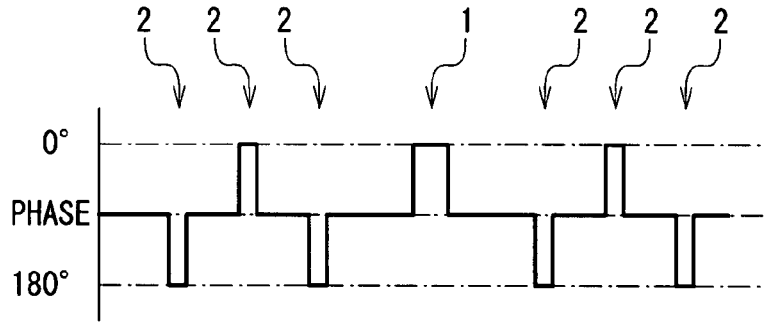

In the case shown in FIGS. 8A, 8B and 8C, as shown in FIGS. 8A, 8B and 8C, the exposure mask 10 has the same structure and the same transmission characteristics as those in the case shown in FIGS. 6A, 6B and 6C, except that the slit lengths L2 gradually increases with distance from the main transmission region 1.

Figure 15:
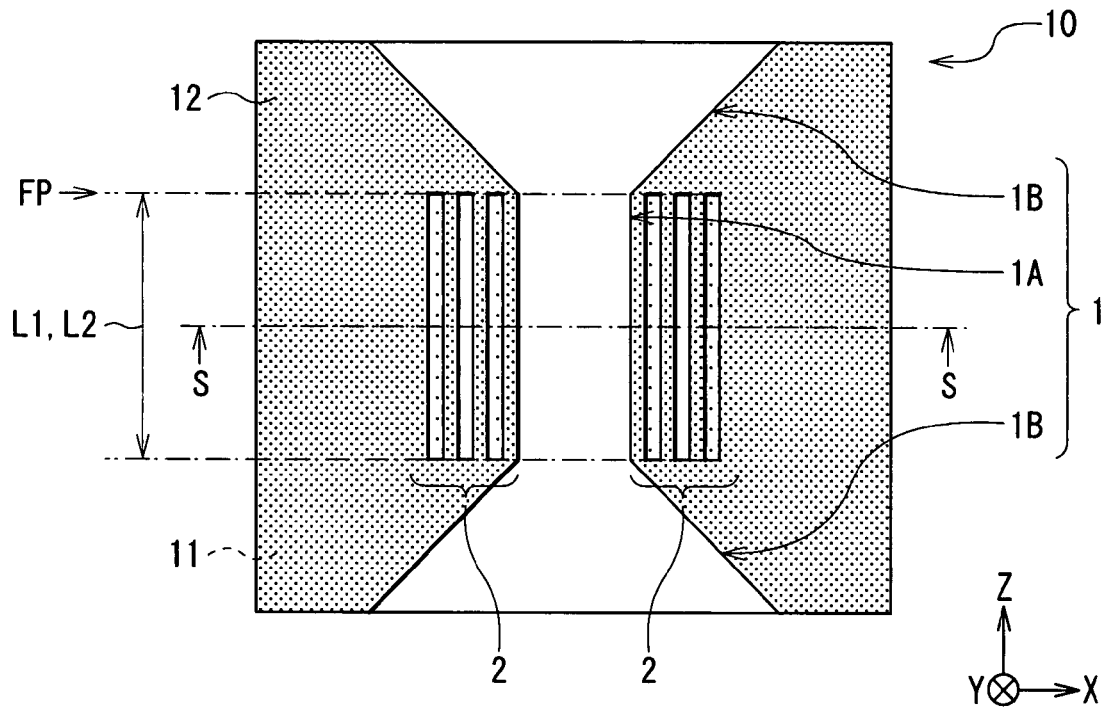
FIG. 15 is a plan view of a first structural example of an exposure mask used in the method of manufacturing a thin film magnetic head.
Figure 16:
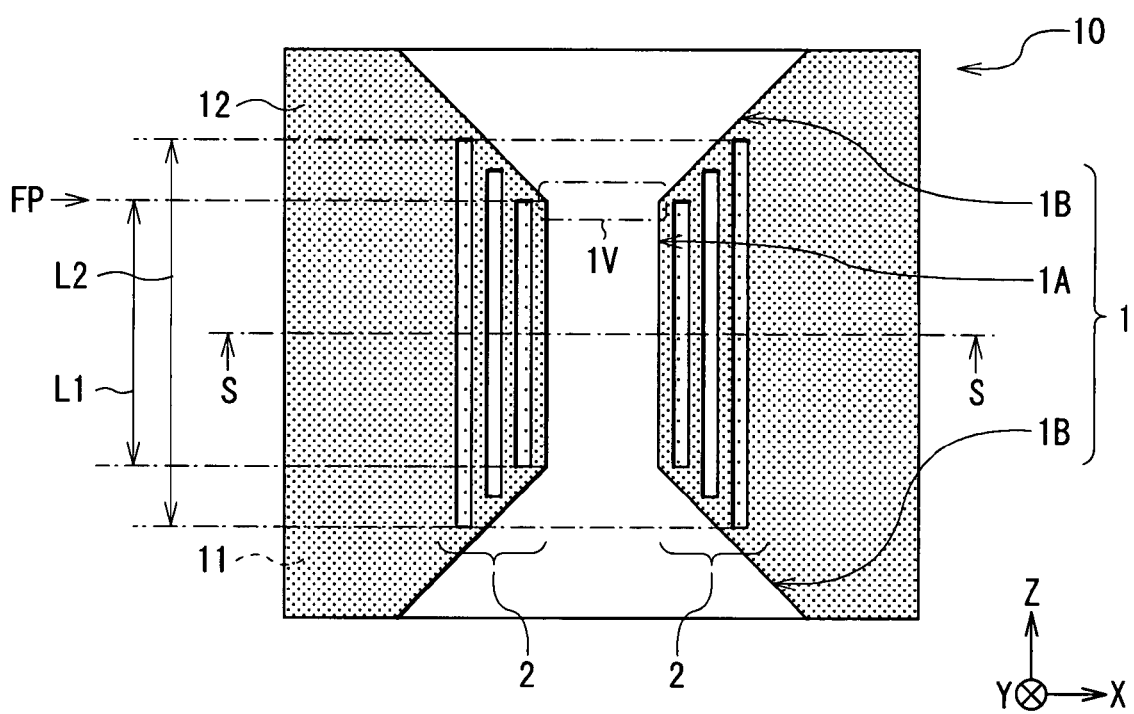
FIG. 16 is a plan view of a second structural example of the exposure mask.
Figure 17:
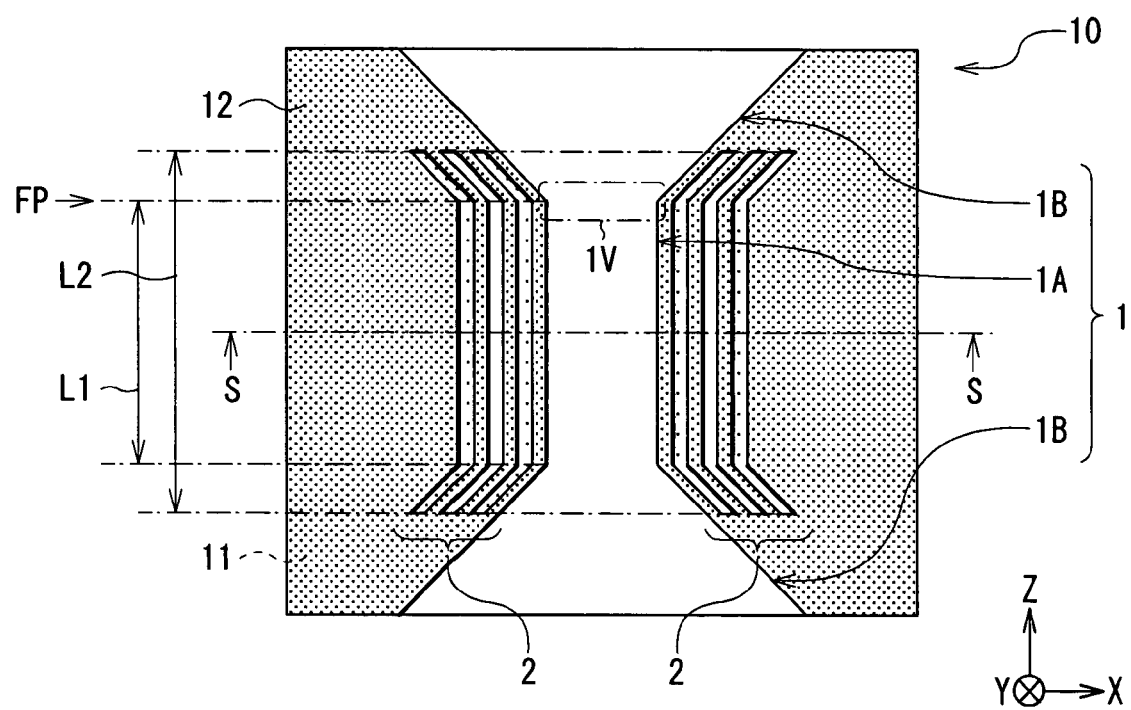
FIG. 17 is a plan view of a third structural example of the exposure mask.

Eight structural examples of the exposure masks 10 determined on the basis of seven structural conditions (1) through (7) are described referring to FIGS. 1A, 1B and 1C through 8A, 8B and 8C here; however, the structure of the exposure mask 10 is not necessarily limited to the structural examples shown in FIGS. 1A, 1B and 1C through 8A, 8B and 8C. Other structural examples except the structural examples shown in FIGS. 1A, 1B and 1C through 8A, 8B and 8C will be briefly described below. The relationship between the slit widths W1 and W2, the relationship between the slit lengths L1 and L2 and the relationship between the spacings S1 and S2 shown in FIGS. 4A, 4B and 4C through 8A, 8B and 8C may be applied to the case shown in FIGS. 1A, 1B and 1C, or the structure of the transparent substrate 11 (including the projections 11T) shown in FIGS. 3A, 3B and 3C may be applied to the cases shown in FIGS. 4A, 4B and 4C through 8A, 8B and 8C. The slit widths W2 or the spacings S2 may not be equal to each other, that is, may be different from each other. In addition to the structural examples shown in FIGS. 1A, 1B and 1C through 8A, 8B and 8C, other structural examples of the exposure masks 10 are shown in FIGS. 15 through 17 which will be described later.

Next, referring to FIGS. 9A, 9B, 9C, 10A, 10B and 10C, a method of forming a thin film pattern will be described below. FIGS. 9A, 9B, 9C, 10A, 10B and 10C are illustrations for describing a method of forming a thin film pattern 24 using the exposure mask 10, and are sectional views corresponding to FIGS. 1B through 8B in order of steps. The case where the exposure masks 10 shown in FIGS. 5A, 5B and 5C and FIGS. 6A, 6B and 6C out of eight exposure masks 10 shown in FIGS. 1A, 1B and 1C through FIGS. 8A, 8B and 8C are used will be described below.

Figure 9A:
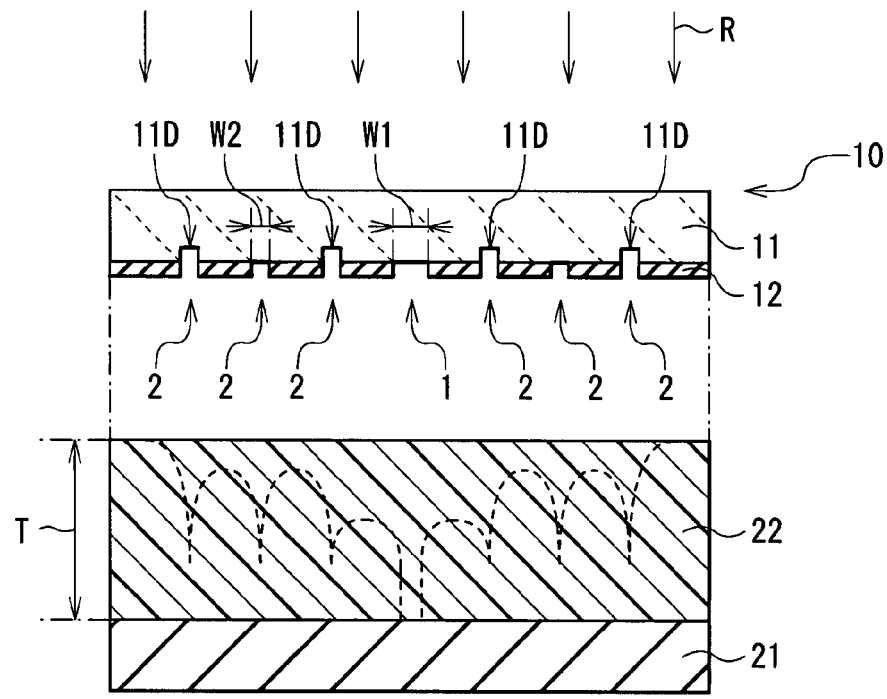
FIGS. 9A, 9B and 9C are sectional views for describing a method of forming a thin film pattern using the exposure mask of the fifth structural example shown in FIGS. 5A, 5B and 5C.

In the case where the exposure mask 10 shown in FIGS. 5A, 5B and 5C is used, at first, as shown in FIG. 9A, a positive resist is applied to the whole surface of a base 21 to form a resist film 22. In this case, the thickness T of the resist film 22 is approximately 0.5 μm or over. The base 21 may be any of various substrates or any of various films.

Next, as shown in FIG. 9A, after the exposure mask 10 faces the resist film 22, exposure light R is applied to the resist film 22 through the use of an exposure apparatus (not shown) so as to expose the resist film 22. In this case, the light-shielding film 12 faces the resist film 22, and as an illumination system for emitting the exposure light R, normal illumination or oblique illumination is used. In the case where the normal illumination is used, a ratio σ(=NA1/NA2) between the numerical aperture NA1 of the illumination system and the numerical aperture NA2 of an optical system is preferably set to be approximately 0.3 or less. As the oblique illumination, annular illumination, bipole illumination, quadrupole illumination or the like can be used. The kind of the exposure apparatus can be selected on the basis of exposure conditions or the like.

In the exposure step, regions corresponding to the main transmission region 1 and the auxiliary transmission regions 2 of the exposure mask 10 in the resist film 22 is selectively exposed. In this case, firstly, the exposure mask 10 includes three pairs of auxiliary transmission regions 2, so compared to the case where two or less pairs of auxiliary transmission regions 2 are included, light intensity contrast is high in an end portion in a slit width direction of the main transmission region 1. Further, as the phase inversion occurs in the main transmission region 1 and the auxiliary transmission regions 2, compared to the case where phase inversion does not occur, the above-described light intensity contrast is higher. Thereby, the exposed range of the resist film 22 can be narrowed in a region corresponding to the main transmission region 1. Secondly, since the slit width W2 is smaller than the slit width W1, in the case where the resist film 22 is developed in a later step, while an aperture 23K is formed in a region corresponding to the main transmission region 1 by setting exposure intensity to an extent to which the aperture 23K can be formed in the resist film 22 in the region corresponding to the main transmission region 1, apertures can be prevented from being formed in regions corresponding to the auxiliary transmission regions 2. Thirdly, when the slit width W2 is smaller than the slit width W1, compared to the case where the slit width W2 is equal to the slit width W1, the exposure of the resist film 22 in a region corresponding to the spacing S1 is reduced, so it is difficult to expose the resist film 22 in the region corresponding to the spacing S1. Thereby, the height (the thickness of the resist film 22) range capable of obtaining desired resolution can be expanded. A broken line shown in the resist film 22 in FIG. 9A shows the outline of the surface of a resist pattern 23 (refer to FIG. 9B) which is formed in a later step, and roughly shows a range where the resist film 22 is exposed to the exposure light R. The meaning of the broken line is also applied to FIG. 10A which will be described later.

Figure 9B:
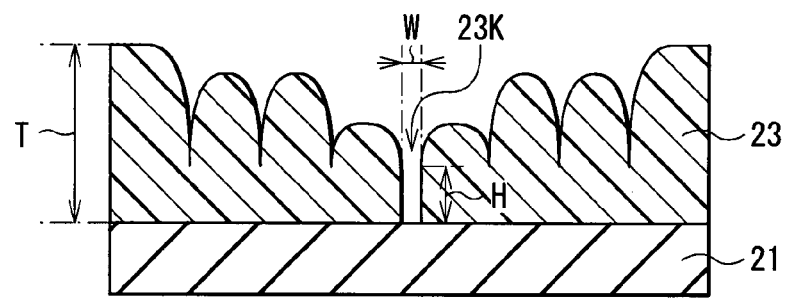

Next, the resist film 22 is developed through the use of a developer liquid to form the resist pattern 23 as shown in FIG. 9B. The kind of the developer liquid can be freely selected on the basis of the kind of the resist film 22 or the like.

In the developing step, the aperture 23K is formed by completely removing the resist film 22 in a region corresponding to the main transmission region 1, and the resist film 22 is depressed by partially removing the resist film 22 in regions corresponding to the auxiliary transmission regions 2. The height H shown in FIG. 9B is a height of a portion having a uniform width W of the aperture 23K. In this case, the width W can be smaller than the slit width W1 of the main transmission region 1.

Figure 9C:
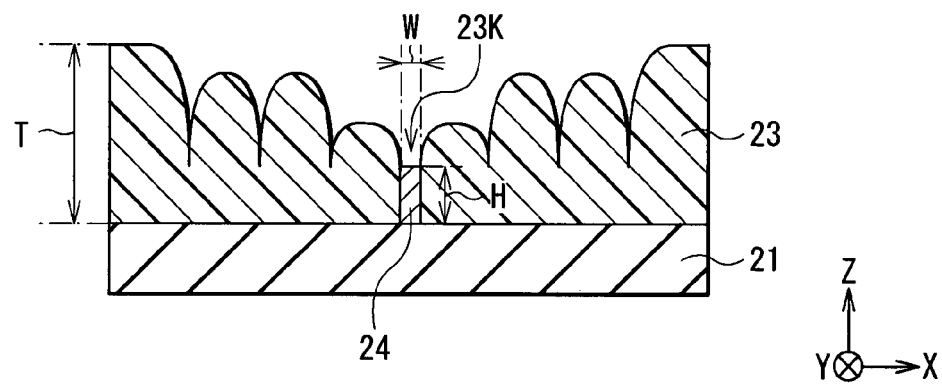

Next, as shown in FIG. 9C, the thin film pattern 24 is formed in the aperture 23K of the resist pattern 23. In this case, to make the width of the thin film pattern 24 uniform in a thickness direction, the thickness of the thin film pattern 24 is equal to or smaller than the height H. As a film forming method for forming the thin film pattern 24, plating, sputtering, chemical vapor deposition (CVD) or the like can be used. In the case where plating is used, a seed layer is formed on the base 21 as an electrode film in advance, and then a plating film is selectively grown through the use of the resist pattern 23 as a frame.

Finally, when the remaining resist pattern 23 is removed, the step of forming the thin film pattern 24 is completed.

Figure 10A:
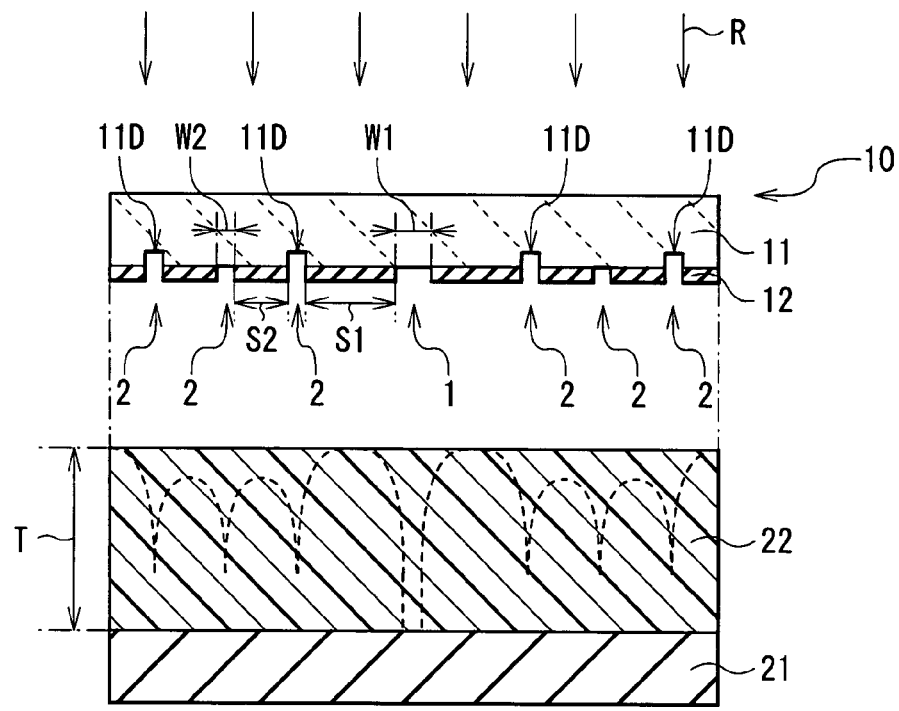
FIGS. 10A, 10B and 10C are sectional views for describing a method of forming a thin film pattern using the exposure mask of the sixth structural example shown in FIGS. 6A, 6B and 6C.
Figure 10B:
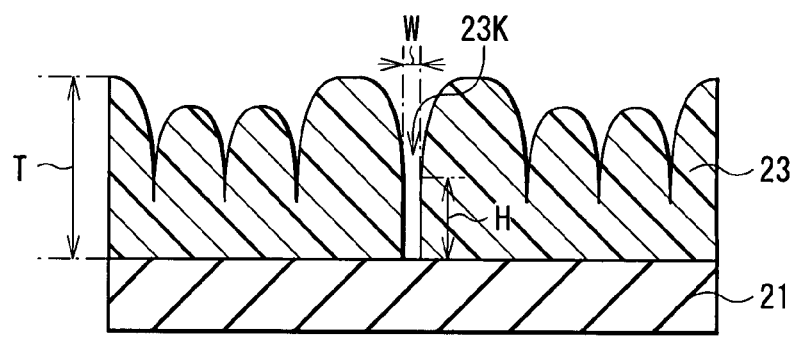
Figure 10C:
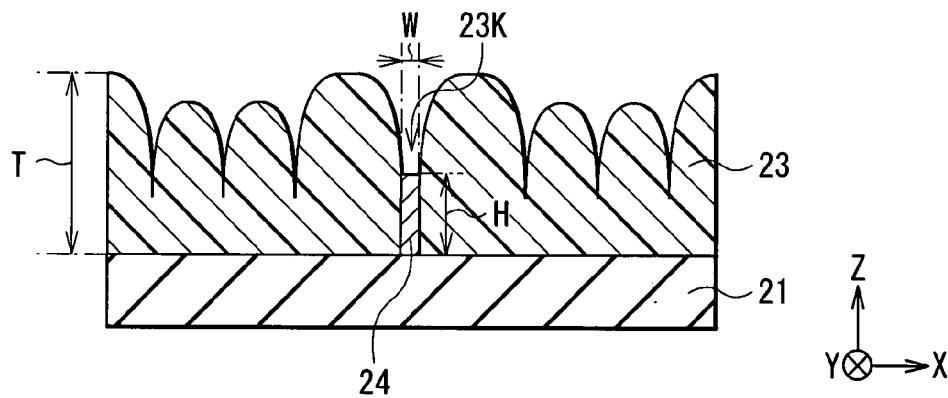

On the other hand, in the case where the exposure mask 10 shown in FIGS. 6A, 6B and 6C is used, as shown in FIGS. 10A, 10B and 10C, the thin film pattern 24 is formed by the same steps as those shown in FIGS. 9A, 9B and 9C.

In the exposure step, as shown in FIG. 10A, the spacing S1 is larger than the spacings S2, so compared to the case shown in FIG. 9A, 9B and 9C, the light intensity contrast in an end portion in a slit width direction of the main transmission region 1 is lower; however, it is more difficult to expose the resist film 22 in a region corresponding to the spacing S1. In this case, when the spacing S1 is set to be sufficiently large, the resist film 22 can be hardly exposed in a region corresponding to the spacing S1.

In the developing step, as shown in FIG. 10B, most of the resist film 22 is not developed and remains in a region corresponding to the spacing S1, so compared to the case shown in FIGS. 9A, 9B and 9C, the height H can be larger.

Functions except for the above-described functions relating to the exposure step and the developing step shown in FIGS. 10A, 10B and 10C are the same as those in the case shown in FIGS. 9A, 9B and 9C.

In the method of forming a thin film pattern according to the embodiment, after the resist pattern 23 is formed by exposing and developing the resist film 22 through the use of the exposure mask 10 including one main transmission region 1 and three or more pairs of auxiliary transmission regions 2, the thin film pattern 24 is formed through the use of the resist pattern 23. In this case, compared to the case where two or less pairs of auxiliary transmission regions 2 are included, the light intensity contrast in an end portion in a slit width direction of the main transmission region 1 is high, so the exposed width of the resist film 22 is narrowed. Therefore, the width W of the aperture 23K of the resist pattern 23 is sufficiently small, so the resolution can be improved. Thereby, the thin film pattern 24 can be formed so as to have a very small uniform width.

In particular, in the embodiment, as shown in FIGS. 2A, 2B and 2C through 8A, 8B and 8C, when phases are inverted in the main transmission region 1 and the auxiliary transmission regions 2, compared to the case where phases are not inverted, the light intensity contrast in an end portion in a slit width direction of the main transmission region 1 is higher. Therefore, in this point of view, the width W can be reduced.

Moreover, in the embodiment, as shown in FIGS. 4A, 4B and 4C and FIGS. 6A, 6B and 6C through 8A, 8B and 8C, when the spacing S1 is larger than the spacings S2, compared to the case where the spacing S1 is equal to the spacings S2, the light intensity contrast in an end portion in a slit width direction of the main transmission region 1 is slightly lower; however, it is difficult to expose the resist film 22 in a region corresponding to the spacing S1. Therefore, although the minimum value of the width W is slightly increased, the height H can be increased.

Further, in the embodiment, when a relationship between the spacing S1 and the thickness T of the resist film 22 satisfies S1≧T×0.095+0.22 µm, while the aperture 23K formed in the resist patterns 23 and depressions are prevented from overlapping one another, the width W can be reduced. Therefore, while reducing the width W, the resist pattern 23 can be formed so as to have the aperture 23K with a desired shape.

In the embodiment, as shown in FIGS. 5A, 5B and 5C through 8A, 8B and 8C, when the slit widths W2 are smaller than the slit width W1, compared to the case where the slit widths W2 are equal to the slit width W1, it is difficult to expose the resist film 22 in a region corresponding to the spacing S1. Therefore, in this point of view, the height H can be increased.

In the embodiment, as shown in FIGS. 7A, 7B, 7C, 8A, 8B and 8C, when all or some of the slit lengths L2 are larger than the slit length L1, compared to the case where the slit lengths L2 are equal to the slit length L1, the resist film 22 is easily and appropriately exposed. More specifically, when the slit lengths L2 are equal to the slit length L1, as shown in FIGS. 6A, 6B and 6C, the improving efficiency of the light intensity contrast is not sufficient in a region corresponding to a near-end portion 1E in a slit length direction of the main transmission region 1, so there is a possibility that the resist film 22 is not exposed with sufficient resolution so as to reflect the pattern shape of the main transmission region 1. On the other hand, in the case where the slit lengths L2 are larger than the slit length L1, as shown in FIGS. 7A, 7B, 7C, 8A, 8B and 8C, the improving efficiency of the light intensity contrast is sufficient in the region corresponding to the near-end portion 1E, so the resist film 22 is exposed with sufficient resolution so as to reflect the pattern shape of the main transmission region 1. Therefore, the resist pattern 23 can be formed with sufficient resolution so that the shape of the aperture 23K has a desired shape reflecting the pattern shape of the main transmission region 1.

Figure 11A:
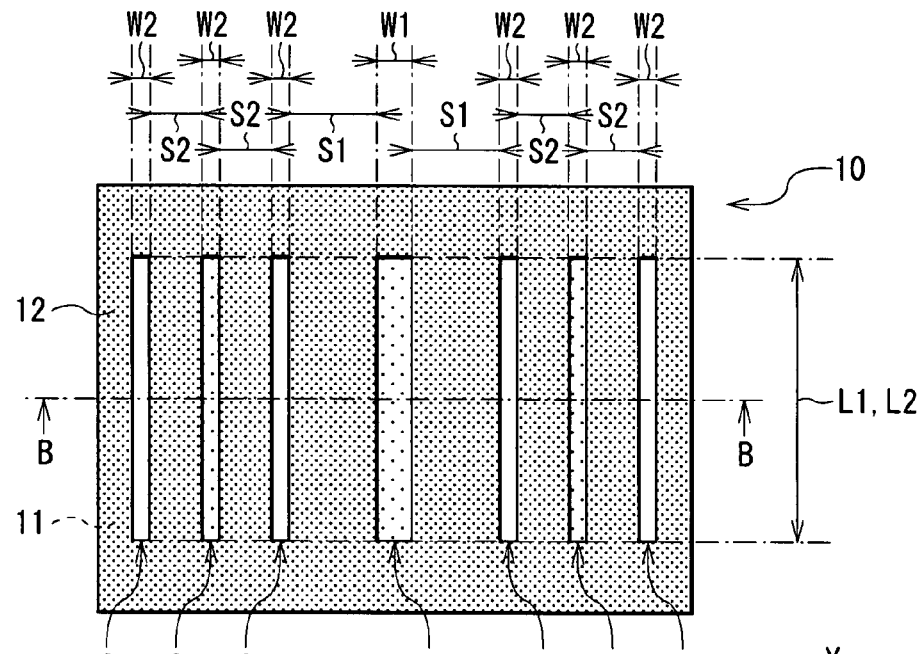
FIGS. 11A, 11B and 11C are illustrations showing a modification of the structure of the exposure mask.
Figure 11B:
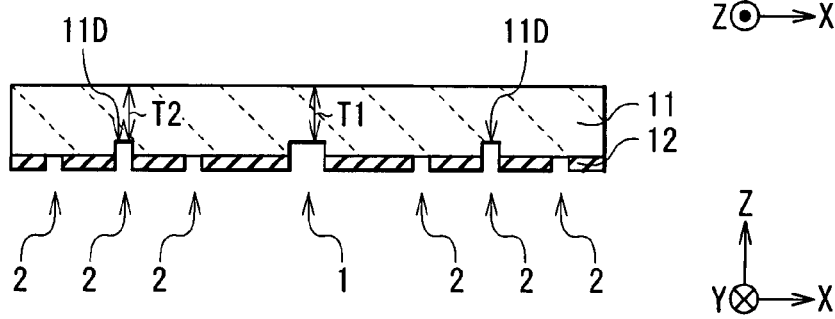
Figure 11C:
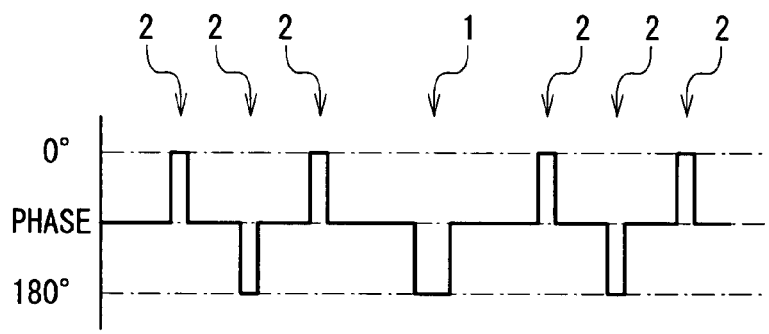

In the embodiment, as shown in FIGS. 2A, 2B and 2C through 8A, 8B and 8C, in the case where phases are inverted in the main transmission region 1 and the auxiliary transmission regions 2, it is set that phases are inverted in order of 0°, 180°, 0°, 180° with distance from the main transmission region 1; however, the embodiment is not necessarily limited to this. More specifically, phases may be inverted in order of 180°, 0°, 180°, 0° by interchanging the positions where the depressions 11D or the projections 11T are arranged and the positions where the depressions 11D or the projections 11T are not arranged with each other. As a specific example, the structure of the exposure mask 10 in which the order of phase inversion is reversed from the case of the exposure mask 10 shown in FIGS. 6A, 6B and 6C is as shown in FIGS. 11A, 11B and 11C. Also in this case, the same effects as those in the case shown in FIGS. 2A, 2B and 2C through 8A, 8B and 8C can be obtained.

Second Embodiment

Next, a second embodiment of the invention will be described below.

Figure 12A:
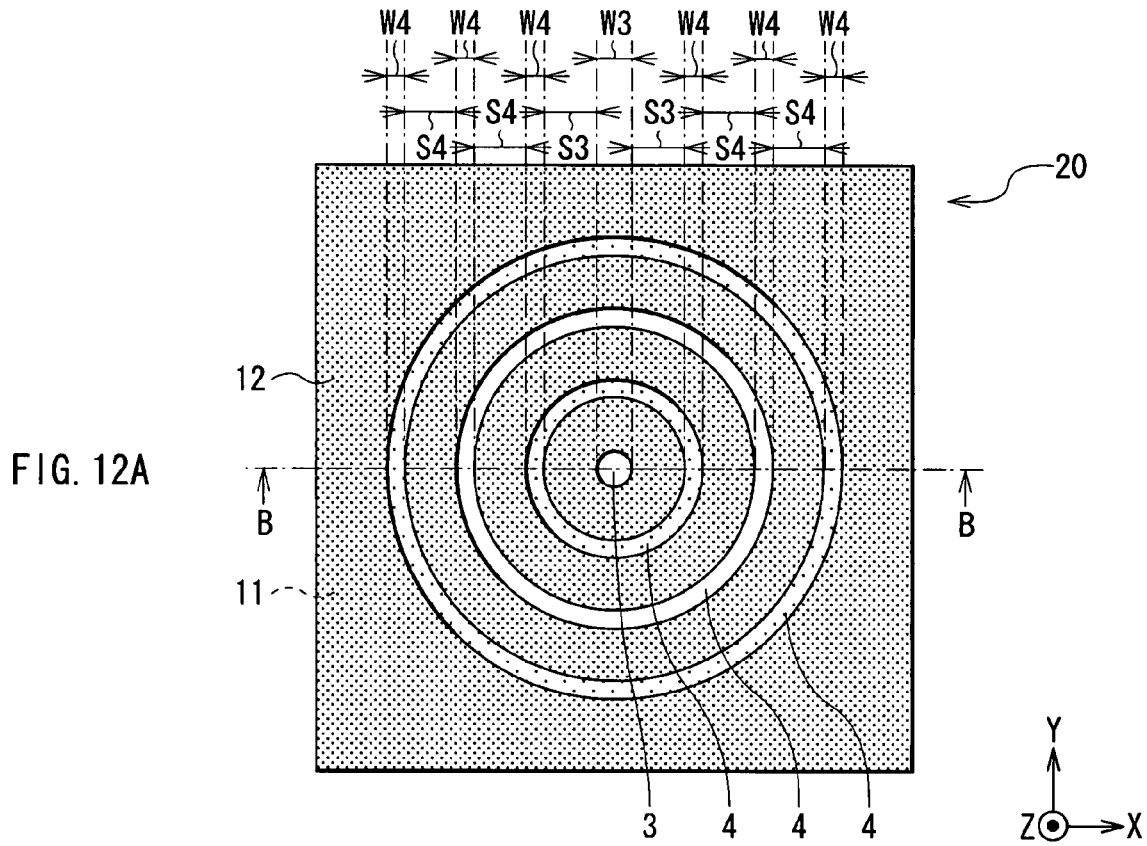
FIGS. 12A, 12B and 12C are illustrations showing a structural example of an exposure mask used in a method of forming a thin film pattern according to a second embodiment of the invention.
Figure 12B:
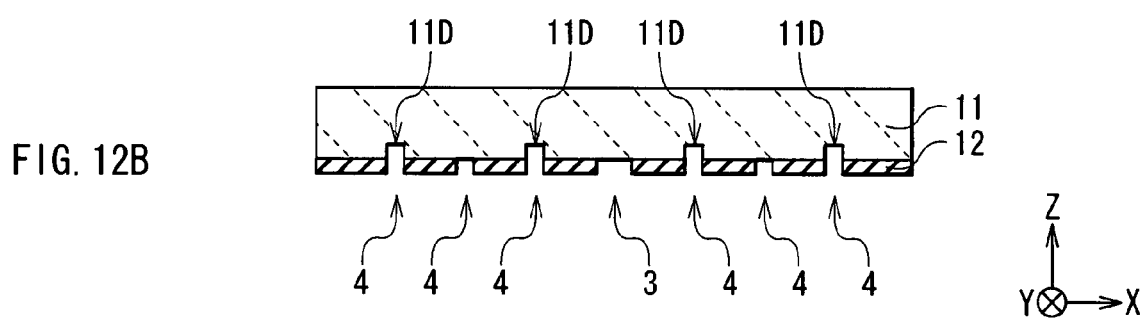
Figure 12C:
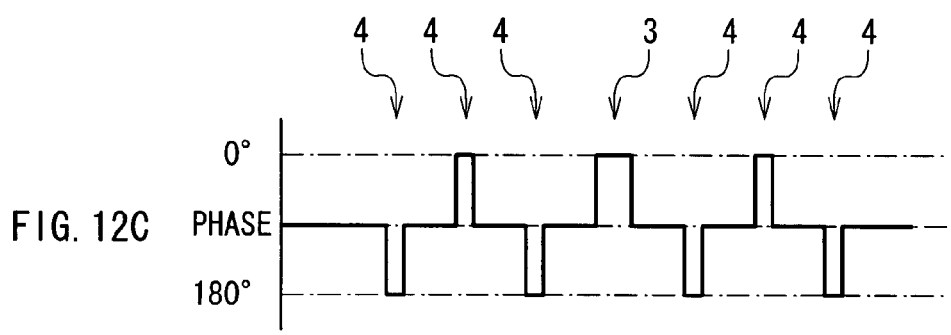

FIGS. 12A, 12B and 12C show a structural example of an exposure mask 20 used in a method of forming a thin film pattern according to the second embodiment of the invention, and FIGS. 12A, 12B and 12C show a plan view, a sectional view and transmission characteristics corresponding to FIGS. 1A, 1B and 1C through FIGS. 8A, 8B and 8C, respectively. In FIGS. 12A, 12B and 12C, like components are denoted by like numerals as of the first embodiment.

The exposure mask 20 includes one main transmission region 3 (with a width W3) and three or more circular auxiliary transmission regions 4 (with a width W4) arranged in order around the main transmission region 3. The main transmission region 3 and one auxiliary transmission region 4 closest to the main transmission region 3 are arranged with a spacing S3, and the auxiliary transmission regions 4 are arranged with a spacing S4. In this case, the main transmission region 3 has, for example, a circular pattern shape. Moreover, each of the auxiliary transmission regions 4 has, for example, a circular pattern shape corresponding to the pattern shape of the main transmission region 3, and three auxiliary transmission regions 4 are arranged.

The structure of the exposure mask 20 except for the above-described structure is the same as the structure of the exposure mask 10 described in the first embodiment. In this case, the dimensional relationships of the slit widths W3 and W4 and the spacings S3 and S4 are the same as the dimensional relationships of the slit width W1 and W2 and the spacings S1 and S2. In FIGS. 12A, 12B and 12C, as a structural example of the exposure mask 20 having a phase inversion function, the case where the structure of the exposure mask 10 shown in FIGS. 5A, 5B and 5C is applied is shown.

In the case where the exposure mask 20 is used, after forming the resist pattern 23, the thin film pattern 24 can be formed through the use of the resist pattern 23 by the same steps as the steps of forming a thin film pattern shown in FIGS. 9A, 9B, 9C, 10A, 10B and 10C in the first embodiment.

In a method of forming a thin film pattern according to the embodiment, when the resist pattern 23 and the thin film pattern 24 are formed through the use of the exposure mask 20 including one main transmission region 3 and three or more auxiliary transmission regions 4, the same effects as those in the first embodiment can be obtained.

In the embodiment, as shown in FIGS. 12A, 12B and 12C, the case where the structure of the exposure mask 10 shown in FIGS. 5A, 5B and 5C is applied to the structure of the exposure mask 20 is described; however, the embodiment is not necessarily limited to this case, and any of the structures of the exposure masks 10 shown in FIGS. 1A, 1B and 1C through FIGS. 4A, 4B and 4C, FIGS. 6A, 6B and 6C through FIGS. 8A, 8B and 8C, and FIGS. 11A, 11B and 11C may be applied to the structure of the exposure mask 20. Also in this case, the same effects as those in the above-described embodiment can be obtained.

Moreover, in the embodiment, each of the main transmission region 3 and the auxiliary transmission regions 4 has a circular pattern shape; however, it is not necessarily limited to this, and the pattern shape can be freely set. As an example, each of the main transmission region 3 and the auxiliary transmission regions 4 may have a rectangular pattern shape. In this case, in particular, the auxiliary transmission regions 4 do not necessarily have a continuous circular shape, and may have a discontinuous circular shape with some gaps. Also in this case, the same effects as those in the above-described embodiment can be obtained.

Figure 14:
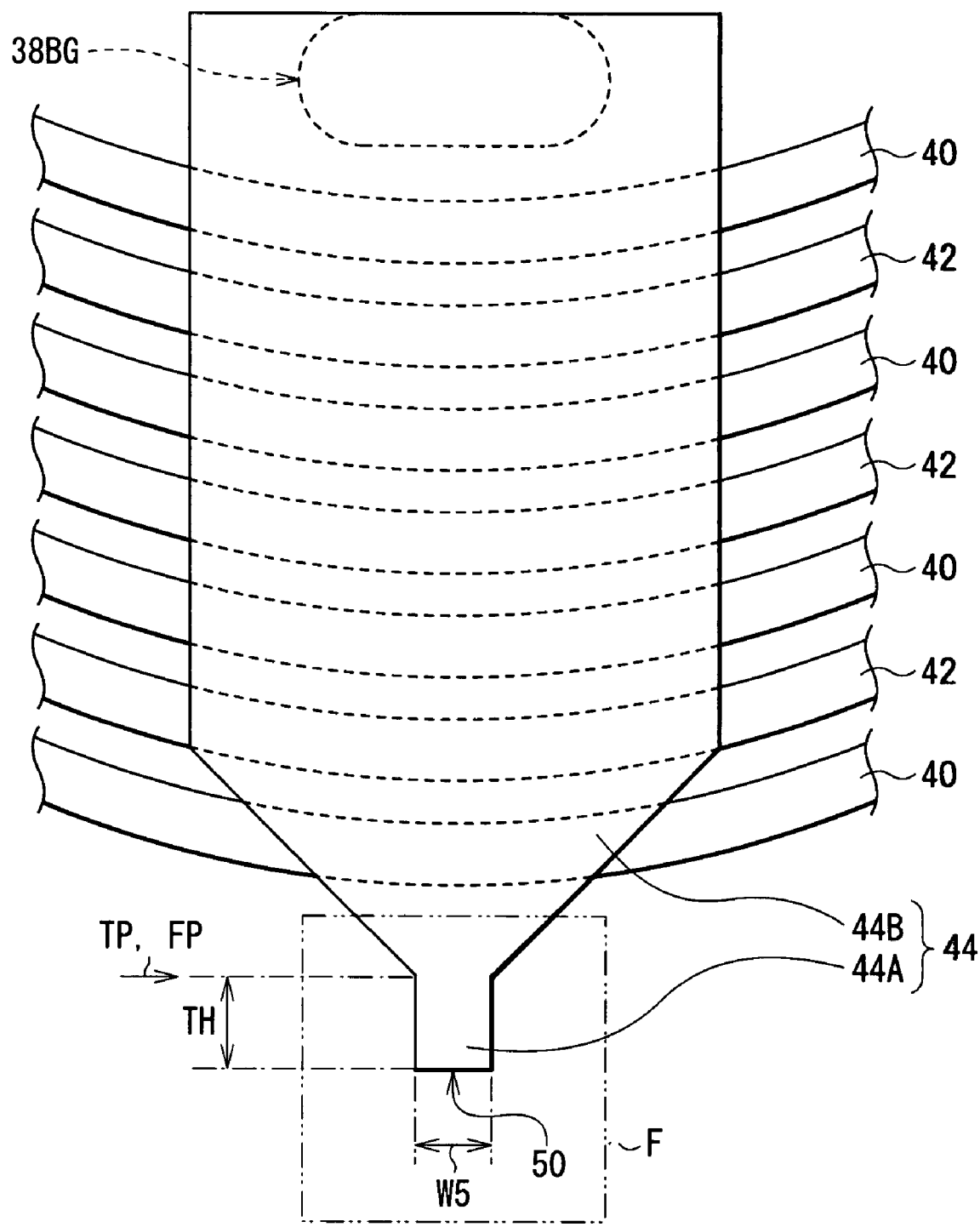
FIG. 14 is a plan view of a main part of the thin film magnetic head shown in FIGS. 13A and 13B.

Next, a method of manufacturing a thin film magnetic head based on the above-described method of forming a thin film pattern will be described below. FIGS. 13A, 13B and 14 show the structure of a thin film magnetic head manufactured by the method of manufacturing a thin film magnetic head. FIG. 13A shows a sectional view parallel to an air bearing surface, and FIG. 13B shows a sectional view perpendicular to the air bearing surface. FIG. 14 shows a plan view of a main part of the thin film magnetic head. Moreover, FIGS. 15 through 17 show three structural examples of the exposure masks 10 used in a step of manufacturing the thin film magnetic head, and show enlarged views of a region corresponding to a region F shown in FIG. 14. In FIGS. 15 through 17, for reference, a position corresponding to the air bearing surface is shown by a line S-S, and a position corresponding to a flare point is shown by an arrow FP. At first, the whole structure of the thin film magnetic head is briefly described referring to FIGS. 13A, 13B and 14, and then the method of manufacturing the thin film magnetic head will be described referring to FIGS. 13A and 13B through 17.

The thin film magnetic head is, for example, a composite head capable of performing a recording process and a reproducing process. More specifically, as shown in FIGS. 13A and 13B, the thin film magnetic head has a structure in which a substrate 31 made of AlTiC ($Al_2O_3 \cdot TiC$), an insulating layer 32, a reproducing head portion 100A, a recording head portion 100B and an overcoat layer 45 are laminated in this order, and an air bearing surface 50 is formed on one end of each of them.

The reproducing head portion 100A performs a reproducing process through the use of a magnetoresistive effect (MR), and is formed by laminating a bottom read shield layer 33, a shield gap layer 34 and a bottom pole layer 35 functioning as a top read shield layer in this order. An MR device 36 and two read layers 37 connected to both sides of the MR device 36 are buried in the shield gap film 34 so as to be exposed to the air bearing surface 50.

The recording head portion 100B is a longitudinal recording head formed by laminating a bottom pole layer 35, a write gap layer 38 including a back gap 38BG, two thin film coils 40 and 42 buried in the insulating layers 39, 41 and 43, and a top pole layer 44 magnetically coupled to the bottom pole layer 35 via the back gap 38BG in this order. A position of an edge closest to the air bearing surface 50 of each of the insulating layers 39, 41 and 43 in which the thin film coils 40 and 42 are buried is a throat height zero position TP, and a distance between the throat height zero position TP and the air bearing surface 50 is a throat height TH.

As shown in FIG. 14, the top pole layer 44 has, for example, a substantially battlebore-like pattern shape, and includes a front end portion 44A extending with a uniform width W5 determining a recording track width and a rear end portion 44B with a width gradually increasing from the uniform width W5 of the front end portion 44A in order from the air bearing surface 50. The position where an increase in the width of the top pole layer 44 starts from the uniform width W5 is a so-called flare point FP. The flare point FP is a position where a magnetic flux is concentrated to supply a sufficient amount of the magnetic flux to the front end portion 44A at the time of flowing the magnetic flux from the rear end portion 44B to the front end portion 44A in the top pole layer 44, and the flare point FP is an important factor contributing to recording performance. In FIGS. 13A, 13B and 14, for example, the case where the flare point FP matches the throat height zero position TP is shown. As shown in FIG. 13A, parts near the air bearing surface 50 of the bottom pole layer 35 and the write gap layer 38 have a width equal to the width W5 of the front end portion 44A, and a series of parts having the width W5 form a trim structure.

The thin film magnetic head is manufactured by laminating a series of components from the insulating layer 32 to the overcoat layer 45 on the substrate 31 through the use of existing thin film processes, and then forming the air bearing surface 50 through the use of, for example, a machining process or a polishing process. The "existing thin film processes" include, for example, film formation techniques typified by plating and sputtering, patterning techniques typified by photolithography, etching techniques typified by dry etching or wet etching, polishing techniques typified by chemical mechanical polishing (CMP) and so on.

When the top pole layer 44 is formed by the application of the above-described method of forming a thin film pattern, three kinds of exposure masks 10 shown in FIGS. 15 through 17 can be used.

More specifically, in the case shown in FIG. 15, the structure of the exposure mask 10 shown in FIGS. 5A, 5B and 5C is applied. More specifically, the pattern shape of the main transmission region 1 corresponds to the pattern shape of the top pole layer 44, and the main transmission region 1 includes a uniform width region 1A corresponding to the front end portion 44A and the widening region 1B corresponding to the rear end portion 44B. In this case, the main transmission region 1 includes, for example, one uniform width region 1A and two widening regions 1B arranged on both sides of the uniform width region 1A. Three pairs (six in total) of auxiliary transmission regions 2 are arranged so as to face each other with the uniform width region 1A in between, and the slit length L2 of each auxiliary transmission region 2 is equal to the slit length L1 of the uniform width region 1A. The relationships between the slit width W1 and W2, the slit widths W2, the slit lengths L1 and L2, the slit lengths L2, the spacings S1 and S2, and the spacings S2 and the order of phase inversion in the main transmission region 1 and the auxiliary transmission regions 2 which are not shown in detail in FIG. 15 are the same as those shown in FIGS. 5A, 5B and 5C.

In the case shown in FIG. 16, the structure of the exposure mask 10 shown in FIGS. 8A, 8B and 8C is applied. More specifically, the exposure mask 10 has the same structure as that shown in FIG. 15, except that the slit lengths L2 of the auxiliary transmission regions 2 gradually increase along the outer edge of the widening region 1B with distance from the uniform width region 1A.

In the case shown in FIG. 17, while the structure of the exposure mask 10 shown in FIGS. 7A, 7B and 7C is applied, the pattern shape of the auxiliary transmission region 2 is changed. More specifically, the slit length L2 of each auxiliary transmission region 2 is larger than the slit length L1 of the uniform width region 1A, and each auxiliary transmission region 2 is bended along an increase in the width of the widening region 1B. For example, the slit lengths L2 of the auxiliary transmission regions 2 are equal to each other. The structure except for the above-described structure is the same as that shown in FIG. 15.

Although three structural examples of the exposure masks 10 are described here referring to FIGS. 15 through 17, the structure of the exposure mask 10 is not necessarily limited to the structural examples shown in FIGS. 15 through 17, and the structural examples shown in FIGS. 1A, 1B and 1C through FIGS. 4A, 4B and 4C and FIGS. 6A, 6B and 6C may be applied as is, or may be changed if necessary as shown in FIG. 17 to be applied.

When the top pole layer 44 is formed, the steps shown in FIGS. 9A, 9B, 9C, 10A, 10B and 10C are performed. More specifically, as shown in FIGS. 13A and 13B, after the bottom pole layer 35 as the base 21, the write gap layer 38 and the insulating layers 39, 41 and 43 (the thin film coils 40 and 42) are formed, the resist film 22 is formed through the use of a positive resist. Next, the resist film 22 is exposed and developed through the use of the exposure mask 10 shown in FIGS. 15 through 17 to form the resist pattern 23 having the aperture 23K. Finally, after the top pole layer 44 as the thin film pattern 24 is formed in the aperture 23K by plating, the remaining resist pattern 23 is removed.

Specific steps of forming the top pole layer 44 except for the above-described steps are the same as those described referring to FIGS. 9A, 9B 9C, 10A, 10B and 10C.

In the method of manufacturing a thin film magnetic head, the top pole layer 44 is formed by the application of the above-described method of forming a thin film pattern, so the top pole layer 44 can be formed so as to have a very small uniform width and a sufficient thickness.

In particular, as shown in FIGS. 16 and 17, in the case where all or some of slit lengths L2 of the auxiliary transmission regions 2 are larger than the slit length L1 of the uniform width region 1A, in a region corresponding to a portion 1V in proximity to the border between the uniform width region 1A and the widening region 1B, the resist film 22 is exposed by the same effects as those described referring FIGS. 7A, 7B, 7C, 8A, 8B and 8C so as to reflect the pattern shape of the main transmission region 1. Therefore, the pattern shape of the top pole layer 44 is determined with high precision in proximity to the flare point FP, so the recording performance of the thin film magnetic head can be secured.

In the above-described method of manufacturing a thin film magnetic head, the case where the top pole layer 44 is formed by the application of the method of forming a thin film pattern is described; however, it is not necessarily limited to this, and any other components except for the top pole layer 44 may be formed by the application of the method of forming a thin film pattern. The above-described method of manufacturing a thin film magnetic head can be applied to not only a method of manufacturing a longitudinal recording type thin film magnetic head but also a method of manufacturing a perpendicular recording type thin film magnetic head. Also in these cases, the same effects can be obtained.

EXAMPLES

Next, examples of the invention will be described below.

As Examples 1-1 through 1-6 and 2-1 through 2-6 and Comparative Examples 1-1 through 1-5 and 2-1 through 2-5A, a series of resist patterns were formed by the following steps.

Example 1-1

At first, after a positive resist (SEPR of Shin-Etsu Chemical Co., Ltd) was applied to the whole surface of a ceramic substrate on which a nickel (Ni) film was formed by a spin coat method, the resist was prebaked (100° C.×90 seconds) through the use of a hot plate to form a resist film with a thickness of 4 µm. Next, after the resist film was selectively exposed (⅕ projection exposure) through the use of the exposure mask having a phase inversion function shown in FIGS. 5A, 5B and 5C together with a KrF excimer stepper (NSR-EX14C of Nikon Corporation), the resist film was baked (110° C.×90 seconds) through the use of a hot plate. In this case, as structural conditions of the exposure mask, the slit width W1 of the main transmission region was 2.0 µm, the slit length L1 was 10.0 µm, the slit width W2 of the auxiliary transmission region was 0.5 µm, the slit lengths L2 were 10.0 µm, and the spacings S1 and S2 were 2.0 µm. Moreover, as exposure conditions, normal illumination was used, and NA was 0.5, σ was 0.5, the exposure energy was 300 mJ/cm² to 500 mJ/cm², and the focus was +1.0 µm. Next, the resist film was developed (60 secconds×4 puddles) through the use of a 2.38% tetramethylammoniumhydroxide solution to form a resist pattern having an aperture.

Example 1-2

The resist pattern was formed by the same steps as those in Example 1-1, except that an exposure mask formed so as not to have a phase inversion function was used.

Example 1-3

The resist pattern was formed by the same steps as those in Example 1-1, except that an exposure mask having a phase inversion function shown in FIGS. 6A, 6B and 6C was used instead of the exposure mask shown in FIGS. 5A, 5B and 5C, and the spacing S1 was 4.0 µm.

Example 1-4

The resist pattern was formed by the same steps as those in Example 1-3, except that an exposure mask formed so as not to have a phase inversion function was used.

Example 1-5

The resist pattern was formed by the same steps as those in Example 1-1, except that the spacings S1 and S2 were 4.0 µm.

Example 1-6

The resist pattern was formed by the same steps as those in Example 1-5, except that an exposure mask formed so as not to have a phase inversion function was used.

Examples 2-1 to 2-6

Six kinds of resist patterns were formed by the same steps as those in Examples 1-1 through 1-6, except that instead of normal illumination, ⅔ annular illumination was used as oblique illumination. The optical conditions in the case where ⅔ annular illumination was used corresponded to optical conditions in the case where a was 0.3 in normal illumination.

Comparative Examples 1-1, 2-1

Two kinds of resist patterns were formed by the same steps as those in Examples 1-1 and 2-1, respectively, except that instead of the exposure mask including the auxiliary transmission regions, an exposure mask not including the auxiliary transmission regions was used.

Comparative Examples 1-2 to 1-5, 2-2 to 2-5

Eight kinds of resist patterns were formed by the same steps as those in Examples 1-1 through 1-4 and 2-1 through 2-4, respectively, except that instead of the exposure mask including three pairs (six in total) of auxiliary transmission regions, an exposure mask including two pairs (four in total) of auxiliary transmission regions was used.

When the dimensions of the resist patterns of the above-described examples and comparative examples were determined, the results shown in Tables 1 and 2 were obtained. Tables 1 and 2 show the widths W (µm) and the height H (µm) of the resist patterns, and Table 1 shows the results of Examples 1-1 through 1-6 and Comparative Examples 1-1 through 1-5, and Table 2 shows the results of Example 2-1 through 2-6 and Comparative Examples 2-1 through 2-5. To determine the widths W and the heights H, after the resist patterns were cut by a focused ion beam etching system (FEI Company Japan Ltd.), the sectional shapes of the resist patterns were observed through the use of a scanning electron microscope (CD-SEM S-9200 of Hitachi Ltd.). The widths W shown in Tables 1 and 2 were the minimum widths obtained in the case where the exposure energy was changed, that is, the widths W show so-called limiting resolution. In Tables 1 and 2, for reference, the structural conditions of the exposure masks (the number of pairs of auxiliary transmission regions, the slit widths W1 and W2, the spacings S1 and S2, the presence or absence of phase inversion and illumination system) are also shown.

TABLE 1

|  | NO. OF PAIRS OF AUXILIARY TRANSMISSION REGIONS | WIDTH W1 (µm) | WIDTH W2 (µm) | SPACING S1 (µm) | SPACING S2 (µm) | PHASE INVERSION | ILLUMINATION SYSTEM | WIDTH W (µm) | HEIGHT H (µm) |
|---|---|---|---|---|---|---|---|---|---|
| EXAMPLE 1-1 | 3 | 2.0 | 0.5 | 2.0 | 2.0 | PRESENCE | NORMAL ILLUMINATION | 0.18 | 1.7 |
| EXAMPLE 1-2 | 3 | 2.0 | 0.5 | 2.0 | 2.0 | ABSENCE | NORMAL ILLUMINATION | 0.20 | 2.0 |
| EXAMPLE 1-3 | 3 | 2.0 | 0.5 | 4.0 | 2.0 | PRESENCE | NORMAL ILLUMINATION | 0.19 | 3.0 |
| EXAMPLE 1-4 | 3 | 2.0 | 0.5 | 4.0 | 2.0. | ABSENCE | NORMAL ILLUMINATION | 0.21 | 3.0 |
| EXAMPLE 1-5 | 3 | 2.0 | 0.5 | 4.0 | 4.0 | PRESENCE | NORMAL ILLUMINATION | 0.20 | 3.0 |
| EXAMPLE 1-6 | 3 | 2.0 | 0.5 | 4.0 | 4.0 | ABSENCE | NORMAL ILLUMINATION | 0.22 | 3.0 |
| COMPARATIVE EXAMPLE 1-1 | 0 | 2.0 | 0.5 | 2.0 | — | — | NORMAL ILLUMINATION | 0.35 | 3.0 |
| COMPARATIVE EXAMPLE 1-2 | 2 | 2.0 | 0.5 | 2.0 | 2.0 | PRESENCE | NORMAL ILLUMINATION | 0.25 | 2.2 |
| COMPARATIVE EXAMPLE 1-3 | 2 | 2.0 | 0.5 | 2.0 | 2.0 | ABSENCE | NORMAL ILLUMINATION | 0.30 | 2.5 |
| COMPARATIVE EXAMPLE 1-4 | 2 | 2.0 | 0.5 | 4.0 | 2.0 | PRESENCE | NORMAL ILLUMINATION | 0.28 | 3.0 |
| COMPARATIVE EXAMPLE 1-5 | 2 | 2.0 | 0.5 | 4.0 | 2.0 | ABSENCE | NORMAL ILLUMINATION | 0.33 | 3.0 |

TABLE 2

| | NO. OF PAIRS OF AUXILIARY TRANSMISSION REGIONS | WIDTH W1 (μm) | WIDTH W2 (μm) | SPACING S1 (μm) | SPACING S2 (μm) | PHASE INVERSION | ILLUMINATION SYSTEM | WIDTH W (μm) | HEIGHT H (μm) |
|---|---|---|---|---|---|---|---|---|---|
| EXAMPLE 2-1 | 3 | 2.0 | 0.5 | 2.0 | 2.0 | PRESENCE | 2/3 ANNULAR ILLUMINATION | 0.15 | 1.7 |
| EXAMPLE 2-2 | 3 | 2.0 | 0.5 | 2.0 | 2.0 | ABSENCE | 2/3 ANNULAR ILLUMINATION | 0.17 | 2.0 |
| EXAMPLE 2-3 | 3 | 2.0 | 0.5 | 4.0 | 2.0 | PRESENCE | 2/3 ANNULAR ILLUMINATION | 0.16 | 3.0 |
| EXAMPLE 2-4 | 3 | 2.0 | 0.5 | 4.0 | 2.0 | ABSENCE | 2/3 ANNULAR ILLUMINATION | 0.18 | 3.0 |
| EXAMPLE 2-5 | 3 | 2.0 | 0.5 | 4.0 | 4.0 | PRESENCE | 2/3 ANNULAR ILLUMINATION | 0.17 | 3.0 |
| EXAMPLE 2-6 | 3 | 2.0 | 0.5 | 4.0 | 4.0 | ABSENCE | 2/3 ANNULAR ILLUMINATION | 0.19 | 3.0 |
| COMPARATIVE EXAMPLE 2-1 | 0 | 2.0 | 0.5 | 2.0 | — | — | 2/3 ANNULAR ILLUMINATION | 0.34 | 3.0 |
| COMPARATIVE EXAMPLE 2-2 | 2 | 2.0 | 0.5 | 2.0 | 2.0 | PRESENCE | 2/3 ANNULAR ILLUMINATION | 0.21 | 2.2 |
| COMPARATIVE EXAMPLE 2-3 | 2 | 2.0 | 0.5 | 2.0 | 2.0 | ABSENCE | 2/3 ANNULAR ILLUMINATION | 0.26 | 2.5 |
| COMPARATIVE EXAMPLE 2-4 | 2 | 2.0 | 0.5 | 4.0 | 2.0 | PRESENCE | 2/3 ANNULAR ILLUMINATION | 0.25 | 3.0 |
| COMPARATIVE EXAMPLE 2-5 | 2 | 2.0 | 0.5 | 4.0 | 2.0 | ABSENCE | 2/3 ANNULAR ILLUMINATION | 0.30 | 3.0 |

It was obvious from the results shown in Table 1 that in the case where normal illumination was used, there were differences in the relationship between the width W and the height H among Examples 1-1 through 1-6 and Comparative Examples 1-1 through 1-5. More specifically, in Comparative example 1-1 in which the exposure mask did not include the auxiliary transmission regions, a sufficient height H was obtained (H=3.0 μm), but the width W was not sufficiently small (W=0.35 μm). The width W in this case was substantially equal to the ⅕ projection width of the slit width W1 (=0.40 μm). Moreover, in Comparative Examples 1-2 through 1-5 in which the exposure mask included only two pairs of auxiliary transmission regions, compared to Comparative Example 1-1, the width W was reduced (W=0.25 to 0.33 μm), but the width W was not sufficiently small. In this case, in Comparative Example 1-2, when the height H was a minimum, the width W became a minimum (H=2.2 μm, W=0.25 μm); however, in spite of sacrificing the height H, the width W in this case was not sufficiently small. On the other hand, in Example 1-1 through 1-6, compared to Comparative Examples 1-1 through 1-5, the width W was reduced, and the width W was sufficiently small (W=0.18 to 0.22 μm). In this case, in Example 1-1, when the height H was a minimum, the width W became a minimum (H=1.7 μm, W=0.18 μm), and the width W in this case was a sufficiently small value as compensation for sacrificing the height H. Moreover, in the Examples 1-3 through 1-6, the width W was sufficiently small (W=0.19 μm to 0.22 μm), and the height H was sufficiently large (H=3.0 μm). Therefore, it was confirmed that in the invention, in a photolithography step using normal illumination, the resolution could be improved, and the height range capable of obtaining desired resolution could be expanded.

Moreover, it was obvious from the results shown in Table 2 that in the case where ⅔ annular illumination was used, there was the same tendency in the relationship between the width W and the height H in Example 2-1 through 2-6 and Comparative Examples 2-1 through 2-5 as that in the case shown in Table 1. Therefore, it was confirmed that in the invention, even in an exposure step using oblique illumination, the improvement in resolution and the expansion of the height range capable of obtaining desired resolution could be achieved. In this case, in particular, as described above, the optical conditions in the case where ⅔ annular illumination was used corresponded to the optical conditions in the case where σ was 0.3 in normal illumination, so it was confirmed that in the case where normal illumination was used, σ was set to be σ≦0.3.

Although the invention is described referring to the embodiments and the examples, the invention is not limited to the embodiment and the examples, and can be variously modified. More specifically, for example, the case where the method of forming a thin film pattern according to the embodiments of the invention is applied to a method of manufacturing a thin film magnetic head is described above; however, it is not necessarily limited to this, and the method of forming a thin film pattern according to the embodiment of the invention may be applied to a method of manufacturing any other device except for the thin film magnetic head. Specific examples of the devices except for the thin film magnetic head include a thin film inductor, a thin film sensor, a thin film actuator, a semiconductor device, an apparatus including them and the like. In the case where the method of forming a thin film pattern is applied to the methods of manufacturing them, the same effects as those in the above embodiments can be obtained.

Moreover, in the above embodiments, the case where the positive resist is used to form a resist pattern having an aperture is described; however, the invention is not necessarily limited to the case, and a negative resist may be used to form a resist pattern not having an aperture (a so-called isolated resist pattern). In this case, the same effects as those in the embodiments can be obtained.

The exposure mask, the method of forming a resist pattern, and the method of forming a thin film pattern according to the embodiments of the invention can be applied to methods of manufacturing various devices such as a thin film magnetic head.

Obviously many modifications and variations of the present invention are possible in the light of the above teachings. It is therefore to be understood that within the scope of the appended claims the invention may be practiced otherwise than as specifically described.

What is claimed is:

1. An exposure mask comprising:
   a slit-shaped main transmission region; and
   three or more pairs of slit-shaped auxiliary transmission regions arranged in order in a direction perpendicular to the longitudinal direction of the main transmission region, each pair of auxiliary transmission regions facing each other with the main transmission region in between.

2. The exposure mask according to claim 1, wherein the main transmission region and the auxiliary transmission regions allow exposure light to pass through in the same phase.

3. The exposure mask according to claim 1, wherein a phase of exposure light passing through a region of the main transmission region and the auxiliary transmission regions is opposite to that of exposure light passing through an adjacent region.

4. The exposure mask according to claim 1, wherein spacings between the main transmission region and one pair of the auxiliary transmission regions closest to the main transmission region are equal to spacings between the auxiliary transmission regions.

5. The exposure mask according to claim 1, wherein spacings between the main transmission region and one pair of the auxiliary transmission regions closest to the main transmission region are larger than spacings between the auxiliary transmission regions.

6. The exposure mask according to claim 5, wherein spacings between the auxiliary transmission regions are equal to each other.

7. The exposure mask according to claim 1, wherein a relationship of $S1 \geq T \times 0.095 + 0.22$ μm is satisfied, where spacings between the main transmission region and one pair of the auxiliary transmission regions closest to the main transmission region are $S1$ (μm), respectively, and the thickness of a resist film exposed to exposure light is $T$ (μm).

8. The exposure mask according to claim 1, wherein the slit widths of the auxiliary transmission regions are equal to the slit width of the main transmission region.

9. The exposure mask according to claim 1, wherein the slit widths of the auxiliary transmission regions are smaller than the slit width of the main transmission region.

10. The exposure mask according to claim 1, wherein the slit lengths of the auxiliary transmission regions are equal to the slit length of the main transmission region.

11. The exposure mask according to claim 1, wherein the slit lengths of the auxiliary transmission regions are larger than the slit length of the main transmission region.

12. The exposure mask according to claim 1, wherein the slit lengths of the auxiliary transmission regions gradually increase with distance from the main transmission region.

13. An exposure mask comprising:
    a main transmission region including a uniform width region extending with a uniform width and a widening region having a width gradually increasing from the uniform width of the uniform width region; and
    three or more pairs of slit-shaped auxiliary transmission regions arranged in order in a direction perpendicular to the longitudinal direction of the main transmission region, each pair of auxiliary transmission regions facing each other with the uniform width region in between.

14. The exposure mask according to claim 13, wherein the slit lengths of the auxiliary transmission regions are equal to the length of the uniform width region in the main transmission region.

15. The exposure mask according to claim 13, wherein the slit lengths of the auxiliary transmission regions gradually increases along the outer edge of the widening region in the main transmission region with distance from the uniform width region in the main transmission region.

16. The exposure mask according to claim 13, wherein the slit lengths of the auxiliary transmission regions are larger than the length of the uniform width region in the main transmission region, and are bended along the outer edge of the widening region in the main transmission region according to an increase in the width of the widening region.

17. The exposure mask according to claim 16, wherein the slit lengths of the auxiliary transmission regions are equal to each other.

18. A method of forming a resist pattern comprising:
    a first step of forming a resist film;
    a second step of selectively exposing the resist film through the use of an exposure mask according to claim 1; and
    a third step of developing the exposed resist film.

19. The method of forming a resist pattern according to claim 18, wherein
    in the first step, the thickness of the resist film is 0.5 μm or over.

20. The method of forming a resist pattern according to claim 18, wherein
    in the second step, oblique illumination is used.

21. The method of forming a resist pattern according to claim 18, wherein
    in the second step, normal illumination is used, and a ratio $\sigma(=NA1/NA2)$ between the numerical aperture NA1 of a illumination system and the numerical aperture NA2 of an optical system is 0.3 or less.

22. A method of forming a thin film pattern comprising:
    a first step of forming a resist pattern by a method of forming a resist pattern according to claim 18; and
    a second step of forming a thin film pattern through the use of the resist pattern.

23. The method of forming a thin film pattern according to claim 22, wherein
    in the first step, a positive resist is used, and
    in the second step, a plating film is selectively grown through the use of the resist pattern as a frame.

24. The method of forming a thin film pattern according to claim 23, wherein
    in the second step, a pole layer of a thin film magnetic head is formed as the thin film pattern.

* * * * *